US012593711B2

(12) United States Patent
Li et al.

(10) Patent No.: US 12,593,711 B2
(45) Date of Patent: Mar. 31, 2026

(54) BONDING STRUCTURE WITH STRESS BUFFER ZONE AND METHOD OF FORMING SAME

(71) Applicant: Taiwan Semiconductor Manufacturing Company, Ltd., Hsin-Chu (TW)

(72) Inventors: SyuFong Li, Taoyuan (TW); Yu-Ping Tseng, Taipei City (TW); Li-Hsien Huang, Hsinchu County (TW); Yao-Chun Chuang, Hsinchu City (TW); Yinlung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 533 days.

(21) Appl. No.: 18/159,938

(22) Filed: Jan. 26, 2023

(65) Prior Publication Data

US 2024/0006352 A1     Jan. 4, 2024

Related U.S. Application Data

(60) Provisional application No. 63/382,138, filed on Nov. 3, 2022, provisional application No. 63/357,092, filed on Jun. 30, 2022.

(51) Int. Cl.
H01L 23/48 (2006.01)
H01L 23/00 (2006.01)
(Continued)

(52) U.S. Cl.
CPC .............. H01L 24/03 (2013.01); H01L 24/05 (2013.01); H01L 24/06 (2013.01); H01L 24/08 (2013.01);
(Continued)

(58) Field of Classification Search
CPC . H01L 2224/08145; H01L 2224/80895; H01L 23/49827; H01L 2224/0401;
(Continued)

(56) References Cited

U.S. PATENT DOCUMENTS 10,090,284 B2   10/2018   Chen et al.
10,854,574 B2   12/2020   Chen et al.
(Continued)

FOREIGN PATENT DOCUMENTS

CN   112771656 A   5/2021
TW   201923918 A   6/2019
(Continued)

*Primary Examiner* — Niki H Nguyen
(74) *Attorney, Agent, or Firm* — HAYNES AND BOONE, LLP

(57) ABSTRACT

A method includes depositing a first dielectric layer on a first substrate of a first device die, etching the first dielectric layer to form a trench, depositing a metallic material in the trench and on a top surface of the first dielectric layer, and performing a chemical mechanical polish (CMP) process to remove a portion of the metallic material from the top surface of the first dielectric layer to form a first metal pad. After the performing of the CMP process, the method selectively etches the first metal pad to form recesses at an edge portion of the first metal pad, deposits a second dielectric layer on a second substrate of a second device die, forms a second metal pad in the second dielectric layer, and bonds the second device die to the first device die.

20 Claims, 27 Drawing Sheets

(51) Int. Cl.
    *H01L 23/52*     (2006.01)
    *H01L 29/40*     (2006.01)

(52) U.S. Cl.
    CPC .............. *H01L 24/80* (2013.01); *H01L 24/19* (2013.01); *H01L 24/20* (2013.01); *H01L 24/32* (2013.01); *H01L 24/94* (2013.01); *H01L 24/95* (2013.01); *H01L 2224/03002* (2013.01); *H01L 2224/0345* (2013.01); *H01L 2224/03452* (2013.01); *H01L 2224/03462* (2013.01); *H01L 2224/0381* (2013.01); *H01L 2224/03831* (2013.01); *H01L 2224/05018* (2013.01); *H01L 2224/05026* (2013.01); *H01L 2224/05166* (2013.01); *H01L 2224/05181* (2013.01); *H01L 2224/05186* (2013.01); *H01L 2224/05546* (2013.01); *H01L 2224/05557* (2013.01); *H01L 2224/0557* (2013.01); *H01L 2224/05647* (2013.01); *H01L 2224/06517* (2013.01); *H01L 2224/0807* (2013.01); *H01L 2224/08145* (2013.01); *H01L 2224/19* (2013.01); *H01L 2224/211* (2013.01); *H01L 2224/214* (2013.01); *H01L 2224/32225* (2013.01); *H01L 2224/80357* (2013.01); *H01L 2224/80379* (2013.01); *H01L 2224/80895* (2013.01); *H01L 2224/80896* (2013.01); *H01L 2224/94* (2013.01); *H01L 2224/95001* (2013.01); *H01L 2924/04941* (2013.01); *H01L 2924/04953* (2013.01); *H01L 2924/0544* (2013.01); *H01L 2924/059* (2013.01); *H01L 2924/351* (2013.01)

(58) Field of Classification Search
    CPC . H01L 2224/12105; H01L 2224/16225; H01L 24/08; H01L 24/19; H01L 24/03; H01L 25/0657; H01L 2224/24101; H01L 2224/24221; H01L 2224/2929; H01L 2225/1058; H01L 2225/1041; H01L 23/5389; H01L 24/24; H01L 25/105; H01L 24/82; H01L 21/76898; H01L 2224/48227; H01L 24/05; H01L 23/49811; H01L 21/481; H01L 21/485; H01L 21/4864; H01L 21/76251; H01L 2224/08146; H01L 2224/48465; H01L 2224/49111; H01L 2224/80815; H01L 2224/81815; H01L 2224/81801; H01L 2224/81894; H01L 2224/83894; H01L 2224/85205; H01L 2224/85207; H01L 23/522; H01L 24/09; H01L 24/12; H01L 24/28; H01L 24/81; H01L 24/90; H01L 2225/06517; H01L 2225/06541; H01L 24/14; H01L 21/187; H01L 2224/16; H01L 2224/48145; H01L 2224/48149; H01L 2224/80001; H01L 24/10; H01L 25/074; H01L 25/0756; H01L 25/0652; H01L 25/071; H01L 25/043; H01L 25/117; H01L 2924/15311; H01L 24/06; H01L 24/80; H01L 24/20; H01L 24/32; H01L 24/94; H01L 24/95; H01L 2224/03002; H01L 2224/0345; H01L 2224/03452; H01L 2224/03462; H01L 2224/0381; H01L 2224/03831; H01L 2224/05026; H01L 2224/05166; H01L 2224/05181; H01L 224/05186; H01L 2224/05546; H01L 2224/05557; H01L 2224/0557; H01L 2224/05647; H01L 2224/05517; H01L 2224/0807; H01L 2224/19; H01L 2224/211; H01L 2224/214; H01L 2224/3225; H01L 2224/80357; H01L 2224/80379; H01L 2224/80896; H01L 2224/94; H01L 2224/95001; H01L 2924/04941; H01L 2924/04953; H01L 2224/0544; H01L 2224/059; H01L 2224/351
    See application file for complete search history.

(56)            References Cited

U.S. PATENT DOCUMENTS

| | | | |
|---|---|---|---|
| 2013/0320556 A1* | 12/2013 | Liu | H01L 24/94 |
| | | | 438/455 |
| 2015/0364434 A1* | 12/2015 | Chen | H01L 25/0657 |
| | | | 257/773 |
| 2019/0096832 A1 | 3/2019 | Tsao et al. | |
| 2020/0006288 A1* | 1/2020 | Chen | H01L 24/80 |
| 2020/0295043 A1 | 9/2020 | Nishida et al. | |
| 2021/0118832 A1 | 4/2021 | Chen et al. | |
| 2021/0335735 A1 | 10/2021 | Chen et al. | |
| 2021/0384247 A1 | 12/2021 | Cheng et al. | |
| 2022/0173059 A1 | 6/2022 | Chen et al. | |

FOREIGN PATENT DOCUMENTS

| | | |
|---|---|---|
| TW | 202032679 A | 9/2020 |
| TW | 202205571 A | 2/2022 |
| TW | 202211478 A | 3/2022 |
| WO | 2020227961 A1 | 11/2020 |

* cited by examiner

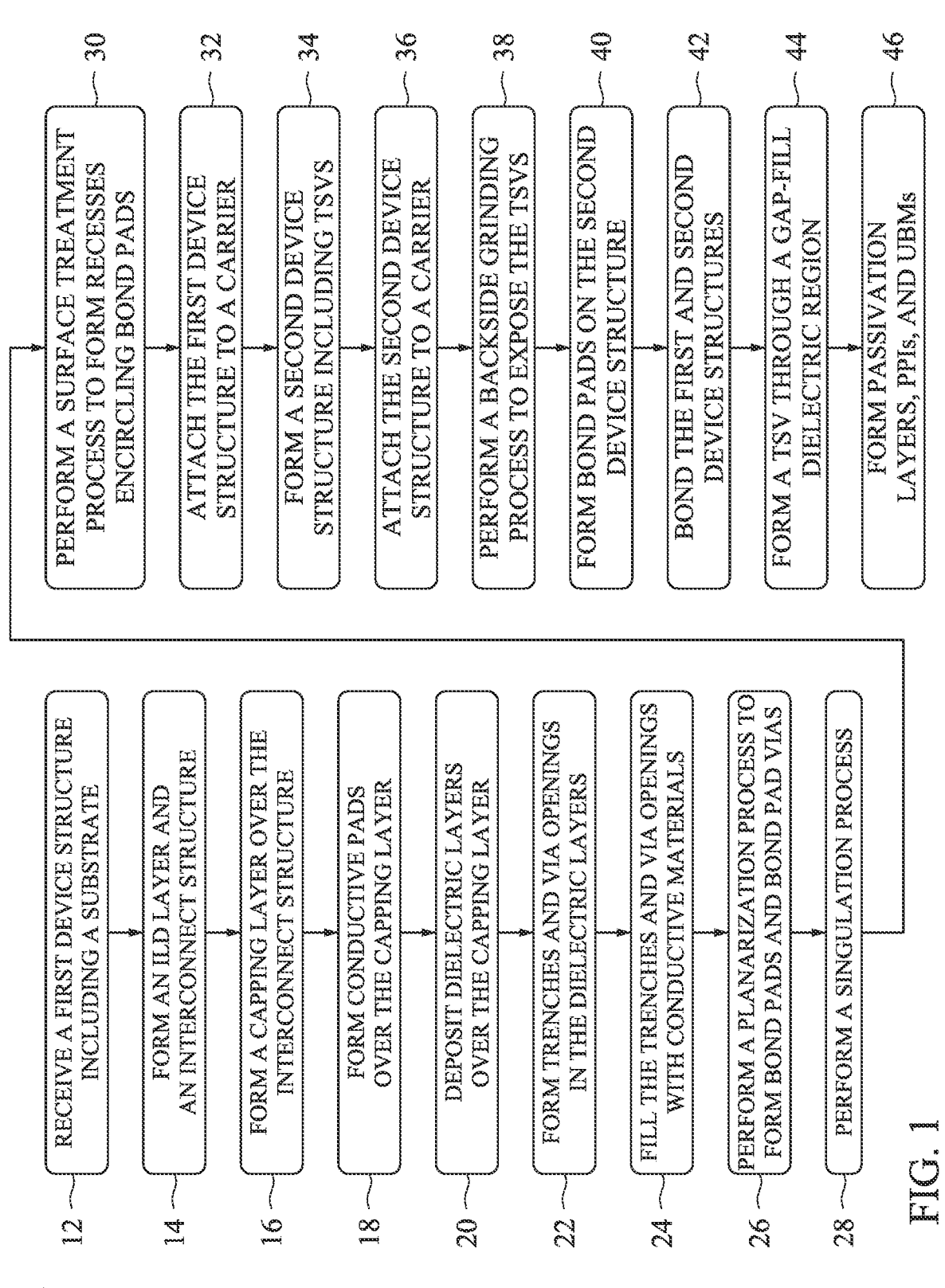

PERFORM A SURFACE TREATMENT PROCESS TO FORM RECESSES ENCIRCLING BOND PADS — 30

ATTACH THE FIRST DEVICE STRUCTURE TO A CARRIER — 32

FORM A SECOND DEVICE STRUCTURE INCLUDING TSVS — 34

ATTACH THE SECOND DEVICE STRUCTURE TO A CARRIER — 36

PERFORM A BACKSIDE GRINDING PROCESS TO EXPOSE THE TSVS — 38

FORM BOND PADS ON THE SECOND DEVICE STRUCTURE — 40

BOND THE FIRST AND SECOND DEVICE STRUCTURES — 42

FORM A TSV THROUGH A GAP-FILL DIELECTRIC REGION — 44

FORM PASSIVATION LAYERS, PPIs, AND UBMs — 46

RECEIVE A FIRST DEVICE STRUCTURE INCLUDING A SUBSTRATE — 12

FORM AN ILD LAYER AND AN INTERCONNECT STRUCTURE — 14

FORM A CAPPING LAYER OVER THE INTERCONNECT STRUCTURE — 16

FORM CONDUCTIVE PADS OVER THE CAPPING LAYER — 18

DEPOSIT DIELECTRIC LAYERS OVER THE CAPPING LAYER — 20

FORM TRENCHES AND VIA OPENINGS IN THE DIELECTRIC LAYERS — 22

FILL THE TRENCHES AND VIA OPENINGS WITH CONDUCTIVE MATERIALS — 24

PERFORM A PLANARIZATION PROCESS TO FORM BOND PADS AND BOND PAD VIAS — 26

PERFORM A SINGULATION PROCESS — 28

BONDING STRUCTURE WITH STRESS BUFFER ZONE AND METHOD OF FORMING SAME

PRIORITY

This claims the benefits to U.S. Provisional Application Ser. No. 63/357,092 filed Jun. 30, 2022 and U.S. Provisional Application Ser. No. 63/382,138 filed Nov. 3, 2022, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, packages of integrated circuits are becoming increasingly complex, with more device dies packaged in the same package to achieve more functions. System-on-integrate-chip (SoIC) has been developed to include a plurality of device dies such as processors and memory cubes in the same package. The SoIC can include device dies formed using different technologies and have different functions bonded to the same device die, thus forming a system. This may save manufacturing cost and optimize device performance. To bond device dies together, two metal pads are pressed against each other at an elevated temperature, and the inter-diffusion of the metal pads causes the bonding of the metal pads. Coefficients-of-thermal-expansion (CTEs) mismatches between metal pads and surrounding dielectric layers may weaken bonding strength. Therefore, there is a need to further develop bonding structures to address these concerns with enhanced circuit performance and reliability.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a method for forming a package, in accordance with some embodiments of the present disclosure.

DETAILED DESCRIPTION

Figure 2:
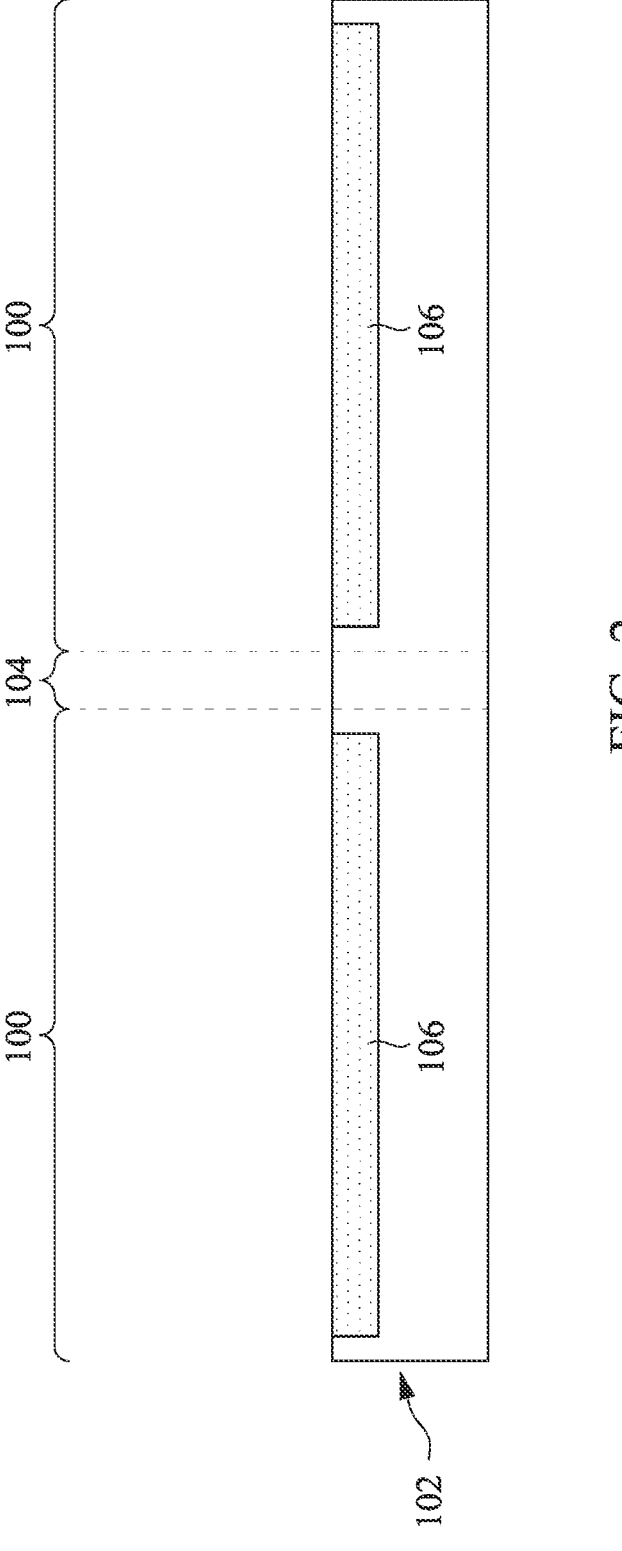
FIGS. 2, 3, 4, 5, 6, 7, 8, 9, 10, 11, 13, 14, 15, 16, 17, 18, 19, 20, 21, 22, and 23 illustrate cross-sectional views of a package during a fabrication process according to the method of FIG. 1, according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure provides various embodiments of system-on-integrate-chip (SoIC) packages and the method of forming the same. Particularly, a bonding structure with stress buffer zone (or stress release zone) is provided. Some variations of some embodiments are discussed. Throughout the various views and illustrative embodiments, like reference numbers are used to designate like elements. The intermediate stages of forming SoIC packages are illustrated in accordance with some embodiments. It is appreciated that although the formation of SoIC packages is used as examples to explain the concept of the embodiments of the present disclosure, the embodiments of the present disclosure are readily applicable to other bonding methods and structures in which metal pads and vias are bonded to each other.

Illustrated in FIG. 1 is a method 10 of semiconductor fabrication including forming a semiconductor device. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2-25B, which represent cross-sectional views of a semiconductor device according to various stages of the method 10, in accordance with some embodiments of the present disclosure.

The method 10 at operation 12 (FIG. 1) provides (or is provided with) a single substrate 102, such as shown in FIG. 2. In FIGS. 2-13, multiple device structures 100 are formed on a single substrate 102 and then singulated to form individual device structures 100 (see FIG. 13). The device structure 100 may be an application-specific integrated circuit (ASIC) chip, an analog chip, a sensor chip, a wireless and radio frequency chip, a voltage regulator chip or a memory chip, for example. The regions labeled "100" in FIGS. 2-11 indicate regions where the device structures 100 shown in FIG. 13 are formed, and the region labeled "104" indicates a scribe line region 104 between adjacent device structures 100.

The substrate 102 may be a semiconductor substrate, such as a bulk semiconductor, a semiconductor-on-insulator (SOI) substrate, a semiconductor wafer, or the like, which may be doped (e.g., with a p-type or an n-type dopant) or undoped. Generally, a SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 102 and features formed thereon are used to form a device die, integrated circuit die, or the like. In the depicted embodiment, integrated circuit device region(s) 106 is formed on the top surface of the substrate 102. Exemplary integrated circuit devices may include complementary metal-oxide semiconductor (CMOS) transistors, fin field-effect transistors (Fin-FETs), resistors, capacitors, diodes, the like, or a combination thereof. The details of the integrated circuit devices are not illustrated herein. In other embodiments, the substrate 102 is used for forming an interposer structure. In such embodiments, no active devices such as transistors are formed on the substrate 102. Passive devices such as capacitors, resistors, inductors, or the like may be formed in the substrate 102. The substrate 102 may also be a dielectric substrate in some embodiments in which the substrate 102 is part of an interposer structure. In some embodiments, through vias (not shown) may be formed extending through the substrate 102 in order to interconnect components on the opposite sides of the substrate 102.

Figure 3:
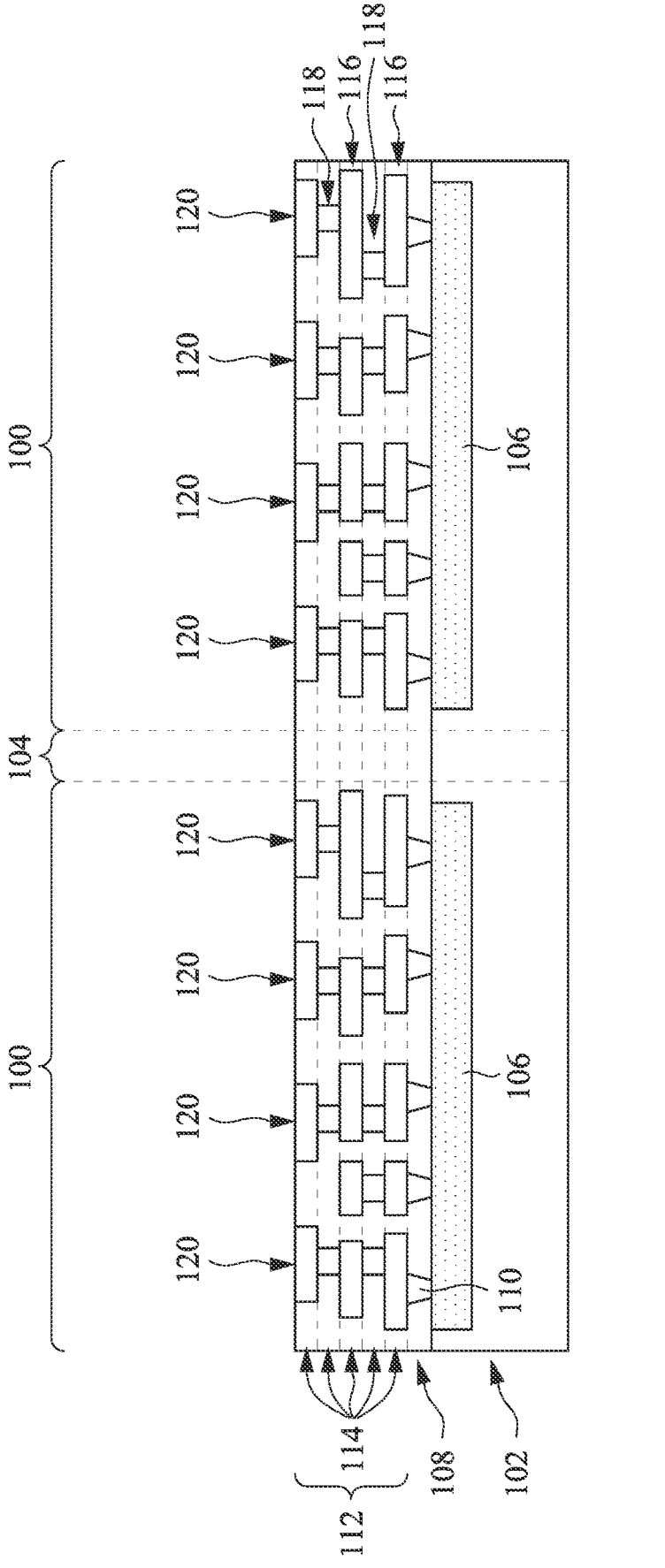

The method 10 at operation 14 (FIG. 1) forms an inter-layer dielectric (ILD) layer 108 over the substrate 102 and an interconnect structure 112 over the ILD layer 108, such as shown in FIG. 3. The ILD layer 108 fills the space between gate stacks of transistors (not shown) in the integrated circuit device region 106. In some embodiments, the ILD layer 108 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like. The ILD layer 108 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs 110 are formed in the ILD layer 108, and are used to electrically connect integrated circuit devices to overlying metal lines and vias. In some embodiments, the contact plugs 110 are formed of a conductive material selected from tungsten, aluminum, copper, titanium, tantalum, titanium nitride, tantalum nitride, alloys therefore, and/or multi-layers thereof. The formation of the contact plugs 110 may include forming contact openings in the ILD layer 108, filling a conductive material(s) into the contact openings, and performing a planarization (such as chemical mechanical polish (CMP) process) to level the top surfaces of the contact plugs 110 with the top surface of the ILD layer 108.

The interconnect structure 112 provides routing and electrical connections between devices formed in the substrate 102, and may be, e.g., a redistribution structure or the like. The interconnect structure 112 may include a plurality of insulating layers 114, which may be inter-metal dielectric (IMD) layers. Each of the insulating layers 114 includes conductive features, such as metal lines 116 and vias 118 formed therein in a metallization layer. In other embodiments, the metal lines may be, for example, redistribution layers. The conductive features may be electrically connected to the active and/or passive devices of the substrate 102 by the contact plugs 110.

The conductive features of the interconnect structure 112 that are formed in the topmost insulating layer 114 are separately labeled as metal pads 120 in FIG. 3. The metal pads 120 may be utilized as for connecting subsequently formed conductive features (e.g., conductive pads, bond pad vias (BPVs), or the like) to the interconnect structure 112. In some embodiments, the conductive features of the topmost insulating layer 114 may also comprise metal lines or vias, which are not separately shown in FIG. 3.

In some embodiments, the insulating layers 114 may be formed from a low-k dielectric material having a k-value lower than about 3.0. The insulating layers 114 may be formed from an extra-low-k (ELK) dielectric material having a k-value of less than 2.5. In some embodiments, the insulating layers 114 may be formed from an oxygen-containing and/or carbon containing low-k dielectric material, Hydrogen SilsesQuioxane (HSQ), MethylSilsesQuioxane (MSQ), the like, or a combination thereof. In some embodiments, some or all of insulating layers 114 are formed of non-low-k dielectric materials such as silicon oxide, silicon carbide (SiC), silicon carbonitride (SiCN), silicon oxycarbonitride (SiOCN), or the like. In some embodiments, etch stop layers (not shown), which may be formed of silicon carbide, silicon nitride, or the like, are formed between insulating layers 114. In some embodiments, the insulating layers 114 are formed from a porous material such as SiOCN, SiCN, SiOC, SiOCH, or the like, and may be formed by spin-on coating or a deposition process such as plasma enhanced chemical vapor deposition (PECVD), CVD, PVD, or the like. In some embodiments, the interconnect structure 112 may include one or more other types of layers, such as diffusion barrier layers (not shown).

In some embodiments, the interconnect structure 112 may be formed using a single and/or a dual damascene process, a via-first process, or a metal-first process. In an embodiment, an insulating layer 114 is formed, and openings (not shown) are formed therein using acceptable photolithography and etching techniques. Diffusion barrier layers (not shown) may be formed in the openings and may include a material such as TaN, Ta, TiN, Ti, CoW, or the like, and may be formed in the openings using a deposition process such as CVD, Atomic Layer Deposition (ALD), or the like. A conductive material may be formed in the openings from copper, aluminum, nickel, tungsten, cobalt, silver, combinations thereof, or the like, and may be formed over the diffusion barrier layers in the openings using an electrochemical plating process, CVD, ALD, PVD, the like, or a combination thereof. After formation of the conductive material, excess conductive material may be removed using, for example, a planarization process such as CMP, thereby leaving conductive features in the openings of the respective insulating layer 114. The process may then be repeated to form additional insulating layers 114 and conductive features therein. In some embodiments, the topmost insulating layer 114 and the metal pads 120 formed therein may be formed having a thickness greater than a thickness of the other insulating layers 114 of the interconnect structure 112. In some embodiments, one or more of the topmost conductive features are dummy metal lines or dummy metal pads 120 that are electrically isolated from the substrate 102.

Figure 4:
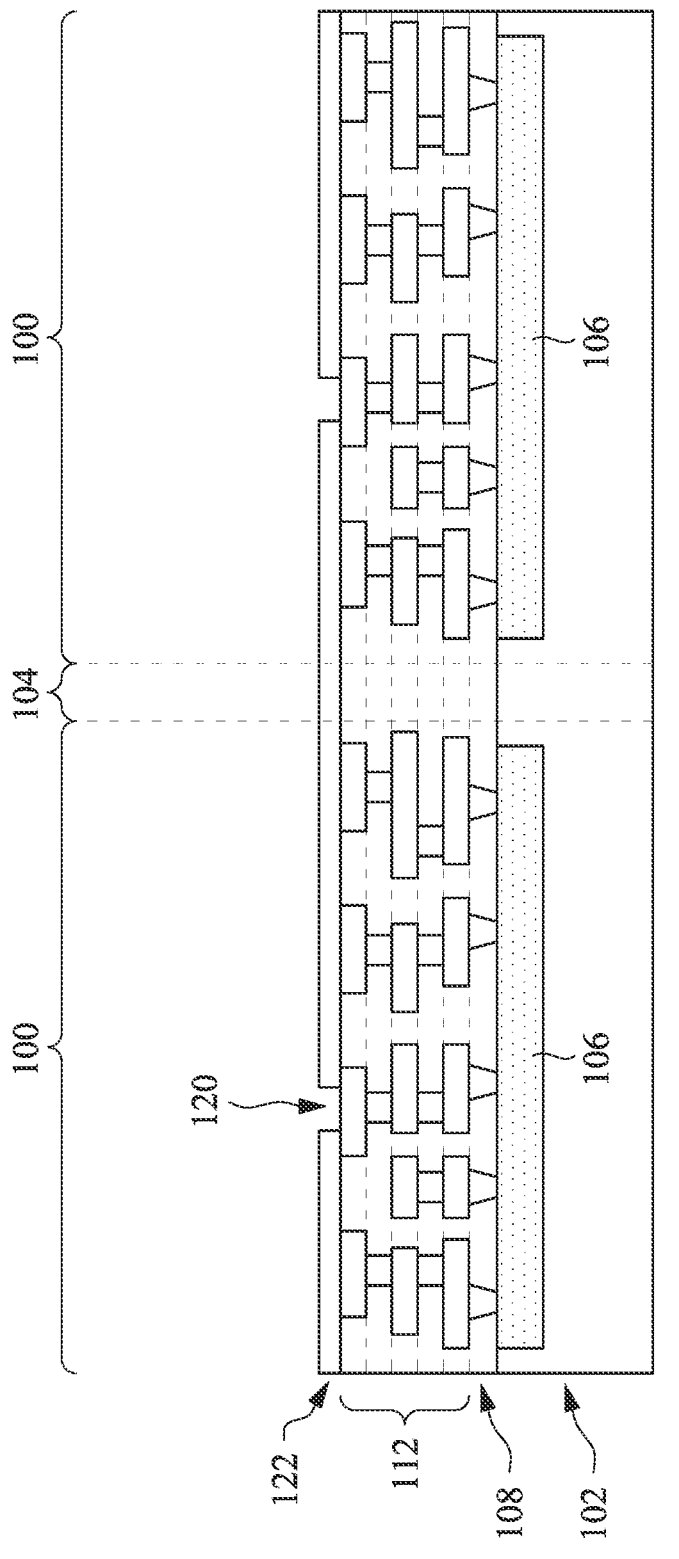

The method 10 at operation 16 (FIG. 1) forms a capping layer 122 over the interconnect structure 112 with one or more openings formed in the capping layer 122, such as shown in FIG. 4. The capping layer 122 may comprise one or more layers of one or more materials. For example, the capping layer 122 may include one or more layers of silicon nitride, silicon oxide, silicon oxynitride, the like, or a combination. The capping layer 122 may be formed using a suitable process such as CVD, PECVD, PVD, ALD, the like, or a combination thereof. In some embodiments, the capping layer 122 may be formed having a thickness greater than a thickness of the topmost insulating layer 114. The openings in the capping layer 122 may be formed using a suitable photolithographic and etching process. For example, a photoresist may be formed over the capping layer 122 and patterned, and then the patterned photoresist used as an etching mask. The capping layer 122 may be etched using a suitable wet etching process and/or dry etching process. The openings are formed to expose portions of the metal pads 120 for electrical connection.

Figure 5:
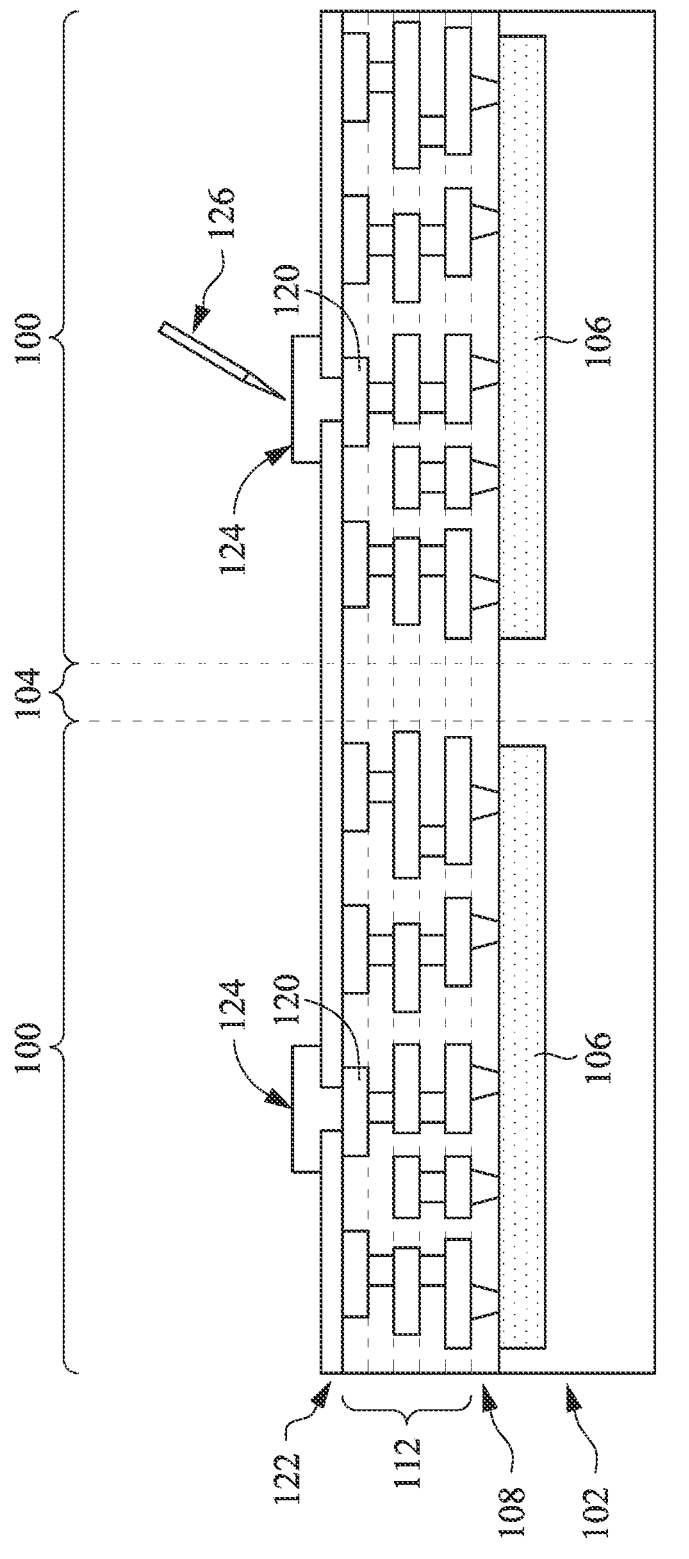

The method 10 at operation 18 (FIG. 1) forms conductive pads 124 over the capping layer 122, such as shown in FIG. 5. One or more conductive pads 124 may be formed extending through the openings in the capping layer 122 to make electrical connection with one or more of the metal pads 120 of the interconnect structure 112. In some embodiments, the conductive pads 124 may be formed by first depositing a blanket layer of a conductive material such as aluminum. For example, CVD, PVD, or the like may be used to deposit a layer of aluminum over the capping layer 122, the openings, and the metal pads 120. A photoresist layer (not separately illustrated) may then be formed over the aluminum layer and the aluminum layer may be etched to form the conductive pads 124. In other embodiments, the conductive pads 124 are formed by first forming a seed layer over the capping layer 122 and the openings. In some embodiments, the seed layer is a metal layer comprising one or more layers, which may be formed of different materials. The seed layer may be formed using, for example, PVD or the like. A photoresist is formed and patterned on the seed layer and conductive material is formed in the openings of the photoresist and on the exposed portions of the seed layer. In some embodiments, the conductive material may be formed using a plating process, such as using an electroplating or electroless plating process, or the like. The conductive material may include one or more materials such as copper, titanium, tungsten, gold, cobalt, the like, or a combination thereof. The photoresist and portions of the seed layer on which the conductive material is not formed are then removed using, for example, a suitable ashing or stripping process, such as using an oxygen plasma or the like. Once the photoresist is removed, remaining exposed portions of the seed layer may be removed using an acceptable etching process, such as a wet etching process or a dry etching process. The remaining portions of the seed layer and conductive material form the conductive pads 124. The conductive pads 124 may be formed using other techniques in other embodiments, and all such techniques are considered within the scope of this disclosure. In some embodiments, the conductive material of the conductive pads 124 may be different than the conductive material of the metal pads 120. For example, the conductive pads 124 may be aluminum and the metal pads 120 may be copper, though other conductive materials may be used.

In some embodiments, the conductive pads 124 that are electrically connected to the interconnect structure 112 may be used as test pads before additional processing steps are performed. For example, the conductive pads 124 may be probed as part of a wafer-acceptance-test, a circuit test, a Known Good Die (KGD) test, or the like. The probing may be performed to verify the functionality of the active or passive devices of the substrate 102 or the respective electrical connections within the substrate 102 or interconnect structure 112. The probing may be performed by contacting a probe needle 126 to the conductive pads 124. Therefore, the conductive pads 124 may also be referred to as probe pads 124. The probe needle 126 may be a part of a probe card that includes multiple probe needles 126 which, for example, may be connected to testing equipment.

Figure 6:
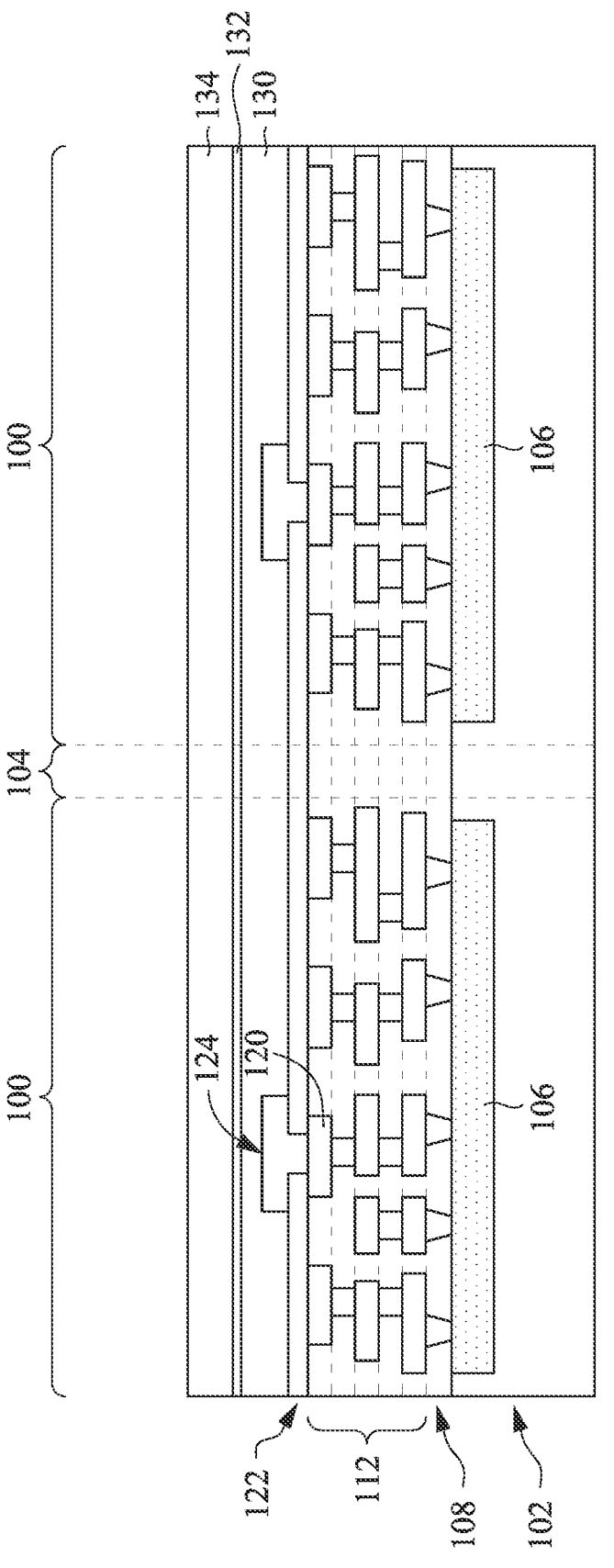

The method 10 at operation 20 (FIG. 1) deposits dielectric layers 130, 132, and 134 over the capping layer 122, such as show in FIG. 6. The dielectric layers 130 and 134 may be formed of silicon oxide, silicon oxynitride, silicon oxycarbide, or the like. The dielectric layer 132 is formed of a dielectric material different from the dielectric material of dielectric layers 130 and 134. For example, the dielectric layer 132 may be formed of silicon nitride, silicon carbide, or the like. The dielectric layer 132 is also referred to as an etch stop layer (ESL) 132. Each of the dielectric layers 130, 132, and 134 may be formed using a deposition process such as CVD, PECVD, PVD, ALD, or the like. The dielectric layer 130 may be formed to have a thickness greater than a thickness of the conductive pads 124 so that the material of the dielectric layer 130 laterally surrounds the conductive pads 124, and so that the dielectric layer 130 may be planarized without exposing the conductive pads 124.

Figure 7:
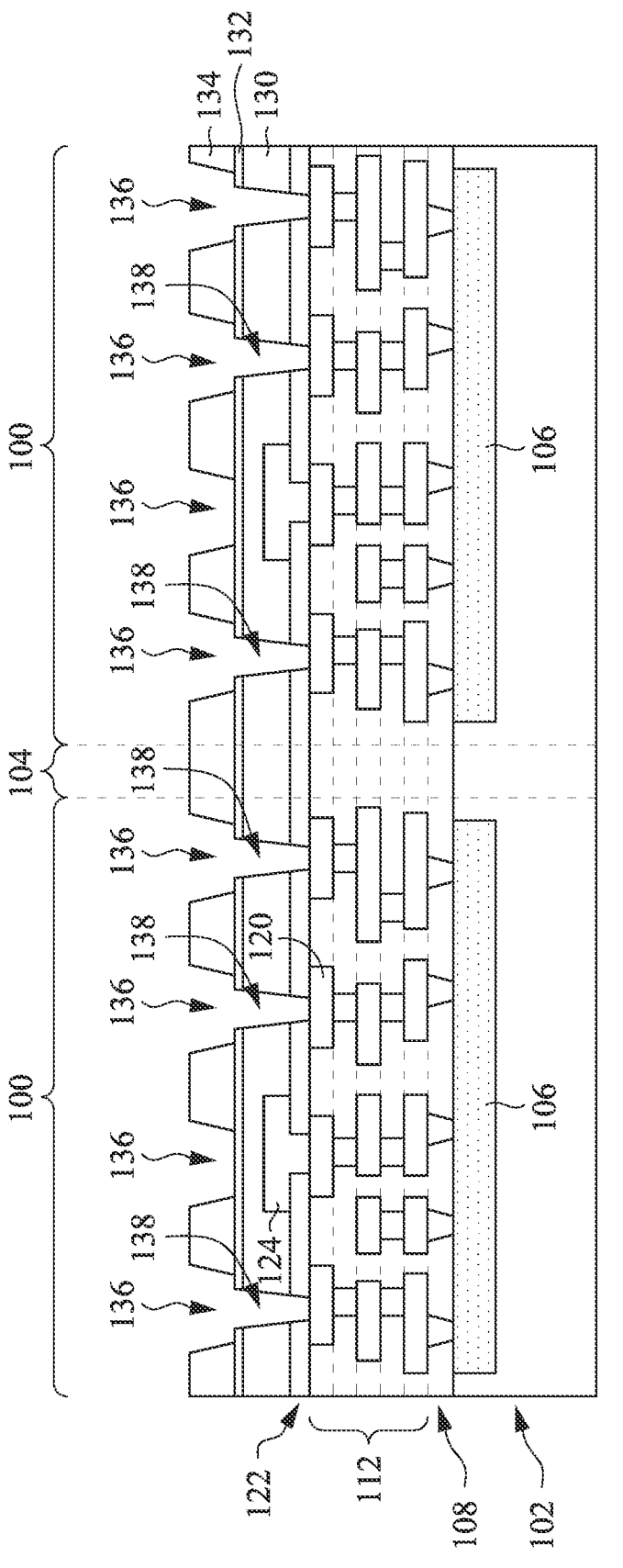

The method 10 at operation 22 (FIG. 1) forms trenches 136 and via openings 138, such as shown in FIG. 7. To form the trenches 136 and the via openings 138, photoresists (not shown) and/or hard masks (not shown) may be formed and patterned over the dielectric layer 134 to aid the formation of the trenches 136 and the via openings 138. In accordance with some embodiments of the present disclosure, an anisotropic etch is performed to form the trenches 136, and the etch stops on the etch stop layer 132. Another anisotropic etch is then performed to form the via openings 138 by etching the exposed etch stop layer 132 and the underlying portions of the dielectric layer 130. In some embodiments, the etch stop layer 132 is not formed, and the trenches 136 and the via openings 138 are formed in a single dielectric layer. The etching may be performed using time mode to allow the etching (for forming the trenches 136) to stop at an intermediate level between a top surface and a bottom surface of the single dielectric layer. The via openings 138 and the trenches 136 expose the metal pads 120 to allow subsequently formed bond pad vias (BPVs) and bond pads to make electrical connection to the interconnect structure 112 through the metal pads 120. Notable, to increase uniformity of the distribution of bond pads, dummy bond pads may be form in regions where bond pads are scarce to facilitate subsequent bonding process to avoid warpages. For example, as the probe pads 124 may be separated from adjacent metal pads 120 by a distance between about 10 μm and about 50 μm and not further connected to bond pads, the regions surrounding the probe pads 124 may represent bond pad scarce regions. Dummy bond pads can be formed in such regions to increase bond pad distribution density. In the illustrated embodiment, some trenches 136 are formed above the probe pads 124 without receiving extra etch process to form via openings 138 therein to expose the probe pads 124. Dummy bond pads will be formed in these trenches in subsequent processes.

Figure 8:
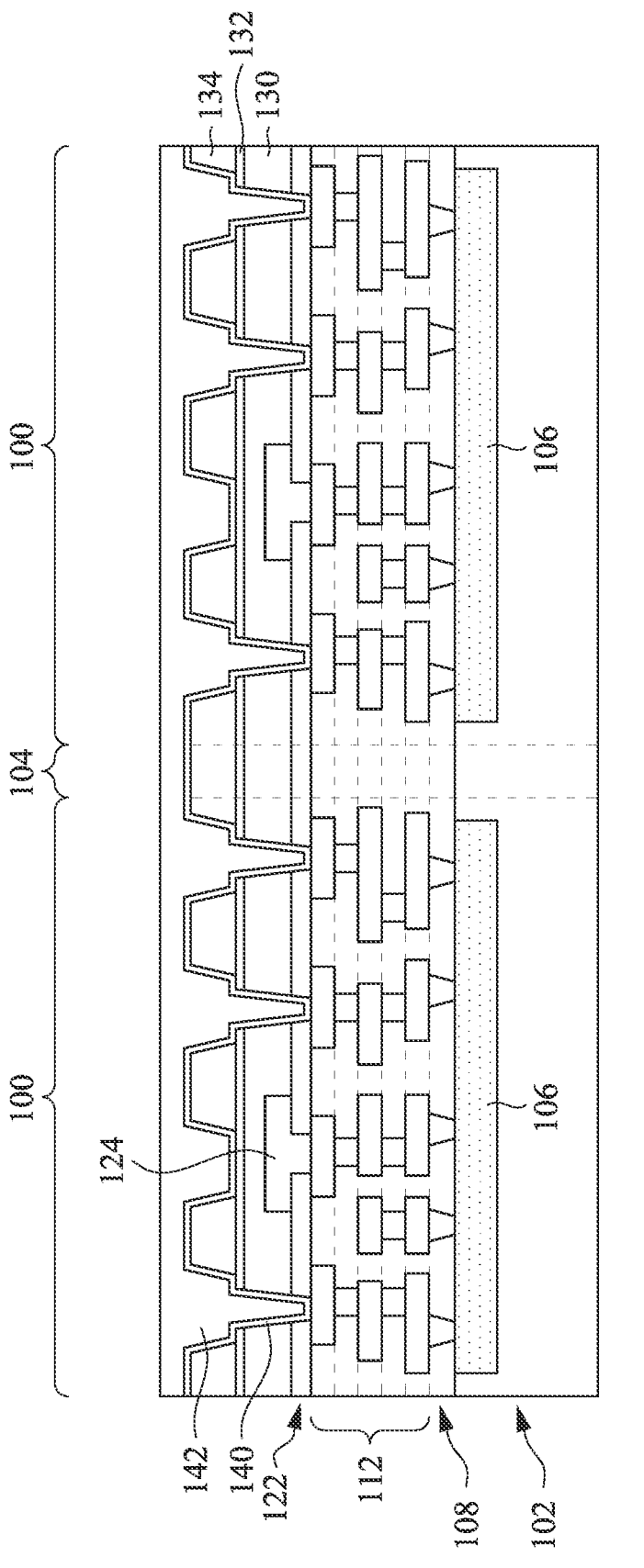

The method 10 at operation 24 (FIG. 1) fills the trenches 136 and the via openings 138 with conductive materials, such as shown in FIG. 8. A barrier layer 140 is conformally deposited. The barrier layer 140 may be, for example, a liner, a diffusion barrier layer, an adhesion layer, or the like. The barrier layer 140 may include one or more layers comprising titanium, titanium nitride, tantalum, tantalum nitride, the like, or combinations thereof. The barrier layer 140 may be deposited as a blanket layer over sidewalls and bottom surfaces of the trenches 136 and the via openings 138. The barrier layer 140 may be formed, for example, using Atomic Layer Deposition (ALD), Physical Vapor Deposition (PVD), or the like. Next, metallic material 142 is deposited, for example, through electro-chemical plating (ECP). The metallic material 142 fills the remaining portions of the trenches 136 and the via openings 138. The metallic material 142 further includes some portions over the top surface of the dielectric layer 134. The metallic material 142 may include copper or copper alloy, or another metallic material that can diffuse in a subsequent anneal process, so that metal-to-metal direct bond may be formed. In some embodiments, the metallic material 142 is copper, and the probe pad 124 is essentially formed of aluminum.

Figure 9:
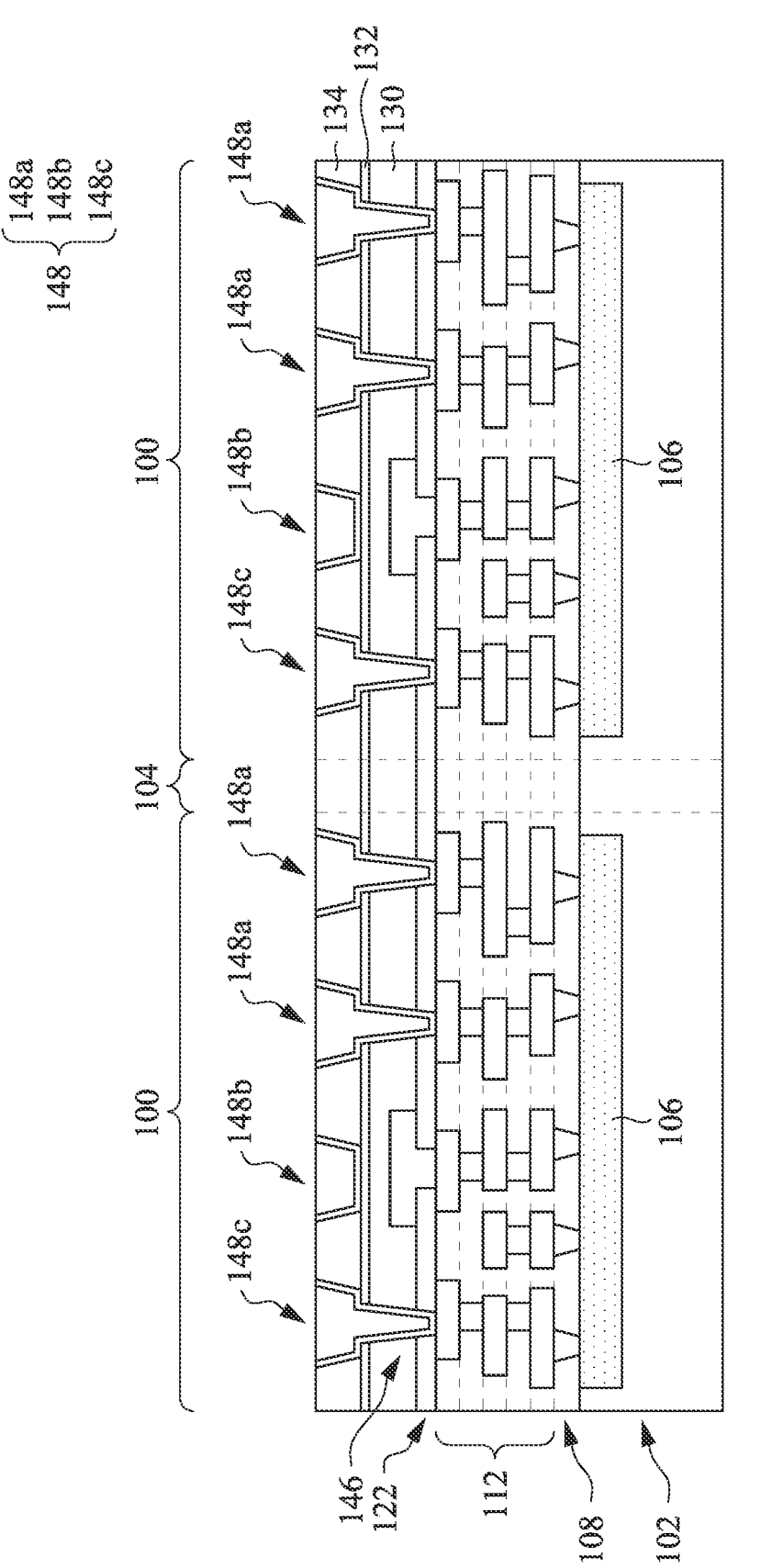

The method 10 at operation 26 (FIG. 1) performs a planarization process, such as a CMP process, to remove excess portions of metallic material 142 and the barrier layer 140, until the dielectric layer 134 is exposed, such as shown in FIG. 9. The remaining portions of the barrier layer 140 and metallic material 142 define bond pad vias (BPVs) 146, bond pads 148a, 148b, 148c (collectively as bond pads 148). FIG. 9 illustrates the metal pads for bonding. It is appreciated that metal lines may also be formed simultaneously as metal pads. The bond pads 148 include bond pads 148a and dummy bond pads 148b, which are used for bonding to device dies, and bond pads 148c (or metal pads 148c), which are used for through vias to land. The bond pads 148a and 148c are electrically coupled to the interconnect structure 112 through BPVs 146. The dummy bond pads 148b are electrically isolated from the interconnect structure 112.

Figure 10:
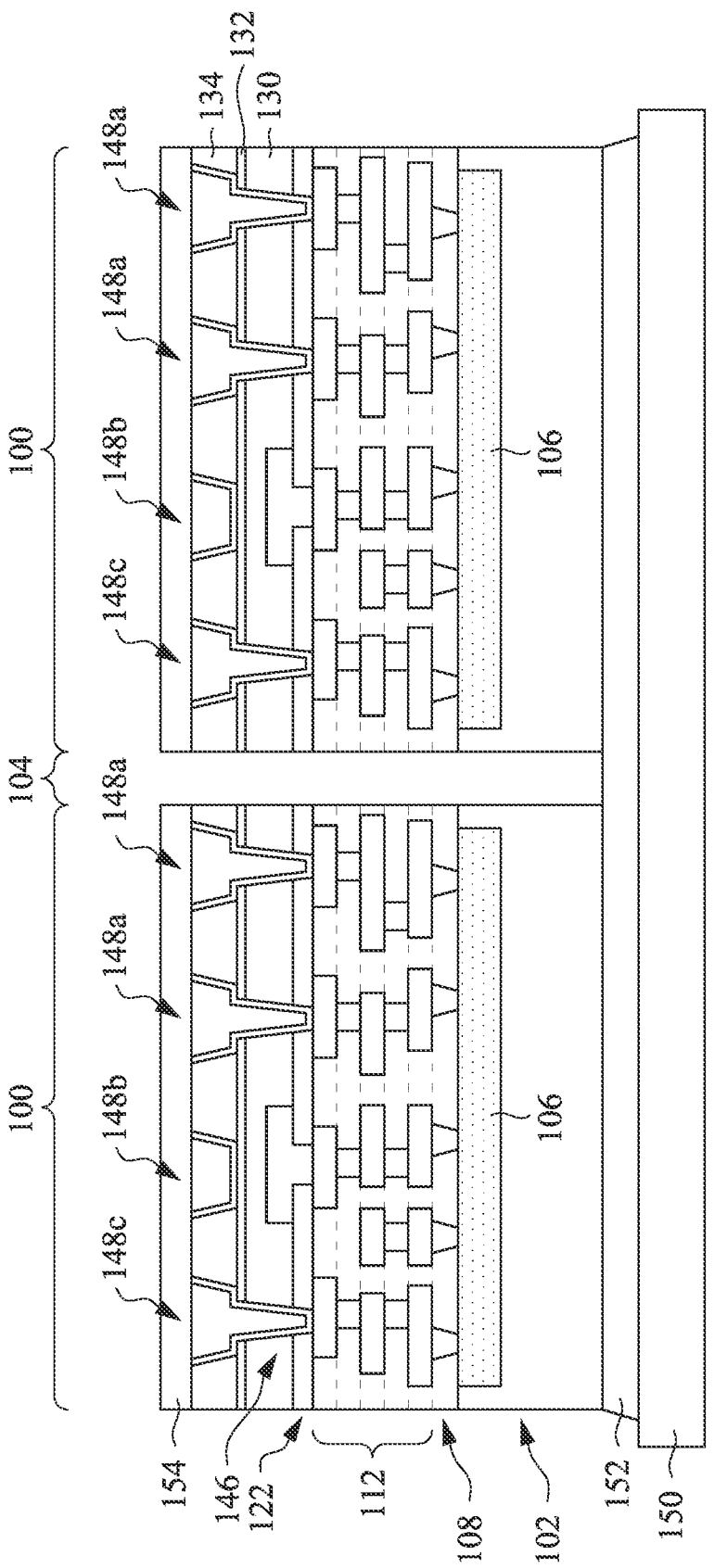

The method 10 at operation 28 (FIG. 1) performs a singulation process along the scribe line regions 104 to separate adjacent device structures 100, such as shown in FIG. 10. Prior to the singulation process, the backside of the substrate 102 is attached to a frame 150 through an adhesive layer 152. In some embodiments, the adhesive layer 152 comprises a die attach film (DAF) such as an epoxy resin, a phenol resin, acrylic rubber, silica filler, or a combination thereof, and is applied using a lamination technique. The frame 150 comprises, for example, silicon based materials, such as glass or silicon oxide, or other materials, such as aluminum oxide, metal, ceramic, polymer, combinations of any of these materials, or the like. However, any other suitable alternative material and method of formation may alternatively be utilized. The singulation process may include a plasma dicing process, a laser dicing process, a sawing process, or a combination thereof. In the depicted embodiment, the singulation process is a plasma dicing process, and a patterned resist layer 154 is formed (before or after attaching the frame 150) on the frontside of the device structures 100 with openings exposing the scribe line regions 104. A process gas for plasma dicing may include $C_4F_6$ or a fluorine-based gas, at a temperature of less than 200° C., an RF power of greater than 50 W, and at a pressure of less than 3 torr. The process gas anisotropically etches through the scribe line regions 104. The patterned resist layer 154 is subsequently removed using, for example, a suitable ashing or stripping process, such as using an oxygen plasma or the like. In some embodiments, a singulated device structure 100 that was probed and found to be Known Good Die (KGD), described above in FIG. 5, is used in subsequent process steps to bond with another device structure 200 (see FIG. 14).

The method 10 at operation 30 (FIG. 1) performs a surface treatment process 158 to form recesses encircling the bond pads 148 as a stress buffer zone (or stress release zone), such as shown in FIG. 11 and FIGS. 12A-12D. In some embodiments, the surface treatment process 158 includes a series of wet cleaning processes. In furtherance of embodiments, the surface treatment process 158 includes a first wet cleaning process to remove remaining residues of the patterned resist layer 154 and metal oxides formed on the bond pads 148 during the previous operations and a second wet cleaning process to form the recesses encircling the bond pads 148.

The first wet cleaning process may be performed by using a cleaning solution. An exemplary cleaning solution includes an ozone in deionized water ($O_3$/DI) cleaning solution or a SPM cleaning solution. The SPM cleaning solution includes a mixture of sulfuric acid, a hydrogen peroxide solution, and pure water. The metal oxides and other remaining residues are removed from the frontside of the device structure 100 in the first wet cleaning process.

The second wet cleaning process may be a selective wet etching process with a suitable etching solution. The second wet cleaning process uses an etching solution different from the first wet cleaning process. The etching solution may be an alkaline solution or an acid solution. An exemplary etching solution includes a mixture of methane, sulfinylbis (methane), hydroxylamine, and water. The etching solution has a selectivity of the bonding metal to the bonding dielectric layer from about 30:1 to about 100:1, such that the dielectric material of the dielectric layer 134 surrounding the bonding metal suffers insignificant etching loss. The etching solution may be applied for a duration of about 10 seconds to about 150 seconds.

Figure 11:
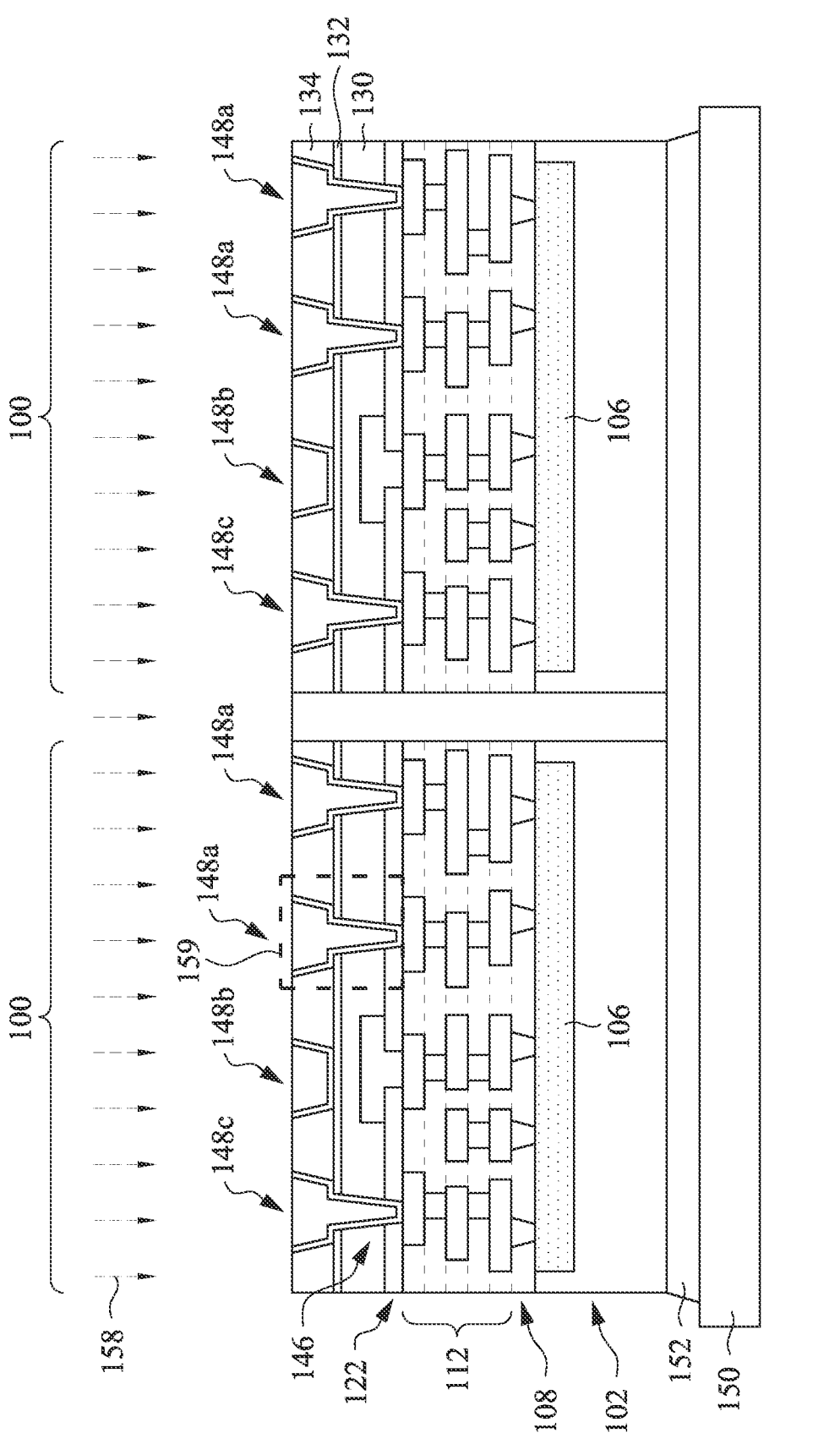
Figure 12A:
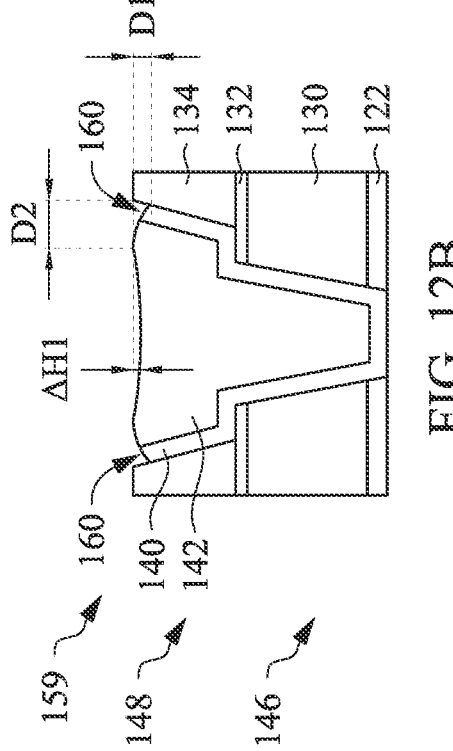
FIGS. 12A, 12B, 12C, and 12D illustrate cross-sectional views of bond pads, in accordance with some embodiments of the present disclosure.

A region 159 in FIG. 11 including a bond pad 148 and a BPV 146 is depicted separately in FIG. 12A and FIGS. 12B-12D to illustrate cross-sectional views of the region 159 before and after receiving the surface treatment process 158, respectively. Referring to FIG. 12A, each of the bond pad 148 and the BPV 146 includes a portion of the barrier layer 140 and the metallic material 142. The metallic material 142 includes edge portions and a middle portion between the edge portions. The barrier layer 140 interposes the metallic material 142 and the dielectric materials of the dielectric layers 130, 132, and 134. Top surfaces of the dielectric layer 134, the barrier layer 140, and the metallic material 142 are substantially coplanar (leveled) after the planarization process at operation 26 with reference to FIG. 9. In the depicted embodiment as in FIG. 12A, no recess (gaps) exists in the bond pad 148 and the dielectric material surrounding it. The metallic materials in the bond pad 148 and the dielectric material surrounding it have different coefficients-of-thermal-expansion (CTEs). For example, the bond pad 148 may include copper, and the dielectric layer 134 may include an organic dielectric material such as polymer. Copper has a CTE of about 16.7 ppm/C°, and a polymer dielectric layer may have a CTE around 22-28 ppm/C°. The CTE mismatch between the material layers in a region having bond pads tend to cause warpage after bonding.

Figure 12B:
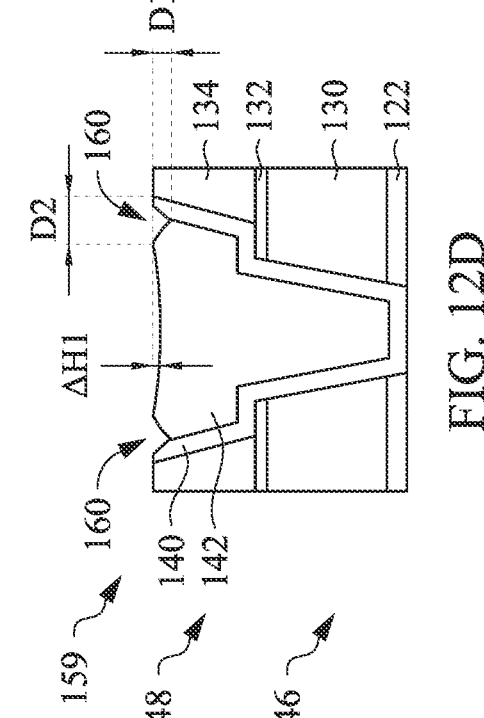
Figure 13:
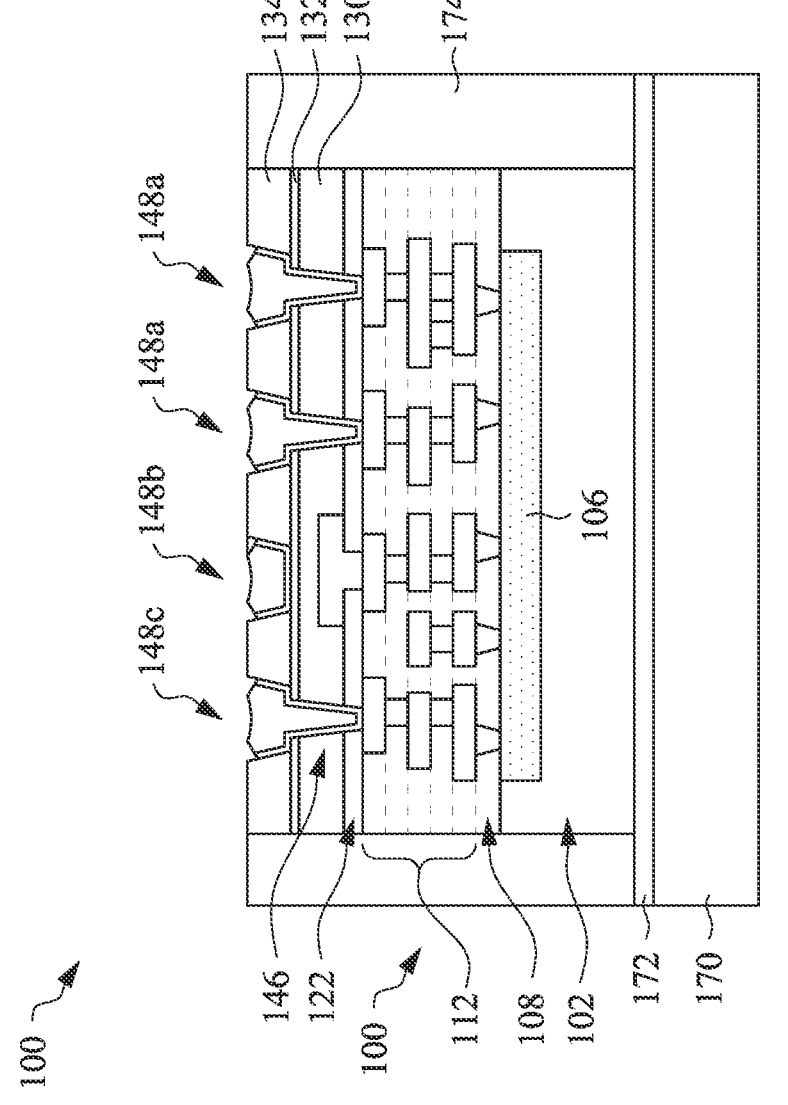

Referring to FIG. 12B, the selective wet etching process during the surface treatment process 158 recesses edge portions of the metallic material 142 and a top portion of the barrier layer 140, so that recesses 160 are formed. The recesses 160 are portions of a recess ring encircling the bond pad 148 from a top view. That is, the recesses 160 may form a ring proximal the edges of the bond pad 148, and some sidewalls of the metallic material 142 and some sidewalls of the barrier layer 140 are exposed in the recesses 160. The recesses 160 have a depth D1 ranging from about 50 nm to about 300 nm and a width D2 ranging from about 50 nm to about 300 nm. In the depicted embodiment as in FIG. 12B, the barrier layer 140 suffers more etching loss than the metallic material 142, and the depth D1 is measured at the dip between the barrier layer 140 and the exposed sidewall of the dielectric layer 134. The selective wet etching process during the surface treatment process 158 may also cause dishing of the top surface of the middle portion of the metallic material 142. The height difference $\Delta H_1$ between the highest point and the lowest point of the top surface at the middle portion of the metallic material 142 (dishing depth) may be in the range between about 1 nm and about 50 nm.

Figure 12C:
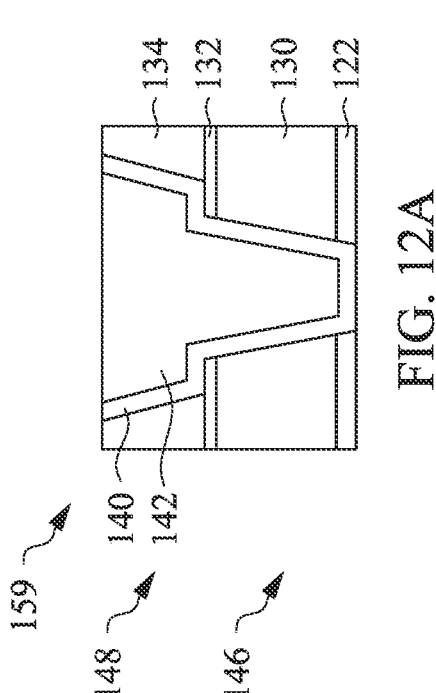
Figure 12D:
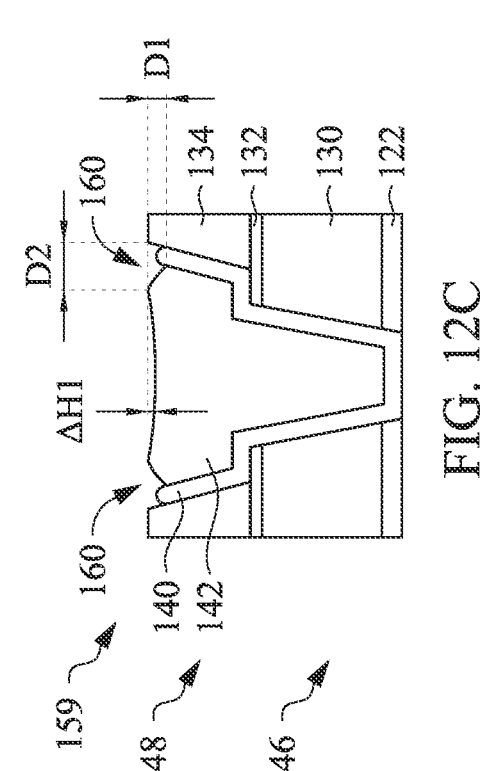

FIG. 12C illustrates an alternative embodiment. The edge portions of the metallic material 142 may be recessed more than the barrier layer 140 such that a bump of the barrier layer 140 is formed in the bottom of the recesses 160, and the depth D1 is measured at the dip between sidewalls of the barrier layer 140 and the metallic material 142. FIG. 12D illustrates another alternative embodiment. The top surface of the barrier layer 140 remains substantially coplanar (leveled) with the top surface of the dielectric layer 134, and the sidewalls of the dielectric layer 134 is not exposed in the recesses 160. The depth D1 is measured at the dip between sidewalls of the barrier layer 140 and the metallic material 142.

In various embodiments, the recesses 160 allow some space for the expansion of the metallic materials during thermal cycles (such as the pre-anneal and anneal). The stress suffered by the bonded structure is thus reduced. In the illustrated embodiment, the selective etching process in forming the recesses 160 is performed after the singulation process at operation 28. In alternative embodiments, the selective etching process in forming the recess 160 may be performed prior to the singulation process at operation 28, such as after the planarization process at operation 26 and prior to the deposition of the patterned resist layer 154 and the attaching of the frame 150. A separate wet cleaning process may be performed after operation 28 to remove the remaining particles of the patterned resist layer 154 and metal oxides from the bond pads 148.

The method 10 at operation 32 (FIG. 1) attaches the device structure 100 to a carrier structure 170 through an adhesive layer 172 using, for example, a pick-and-place process, such as shown in FIG. 13. The carrier structure 170 may be a silicon substrate (e.g., a silicon wafer), a glass substrate, an organic substrate (e.g., a panel), or the like. The adhesive layer 172 may be substantially similar to the adhesive layer 152 discussed above. Dielectric regions 174 (otherwise known as "gap-fill dielectric" regions) are formed surrounding the device structure 100, in some embodiments. The dielectric regions 174 may be formed from one or more layers of silicon oxide, PSG, BSG, BPSG, FSG, silicon nitride, the like, or a combination thereof. The dielectric material of the dielectric regions 174 may be formed using a deposition process such as CVD, PECVD, PVD, the like, or a combination thereof.

Figure 14:
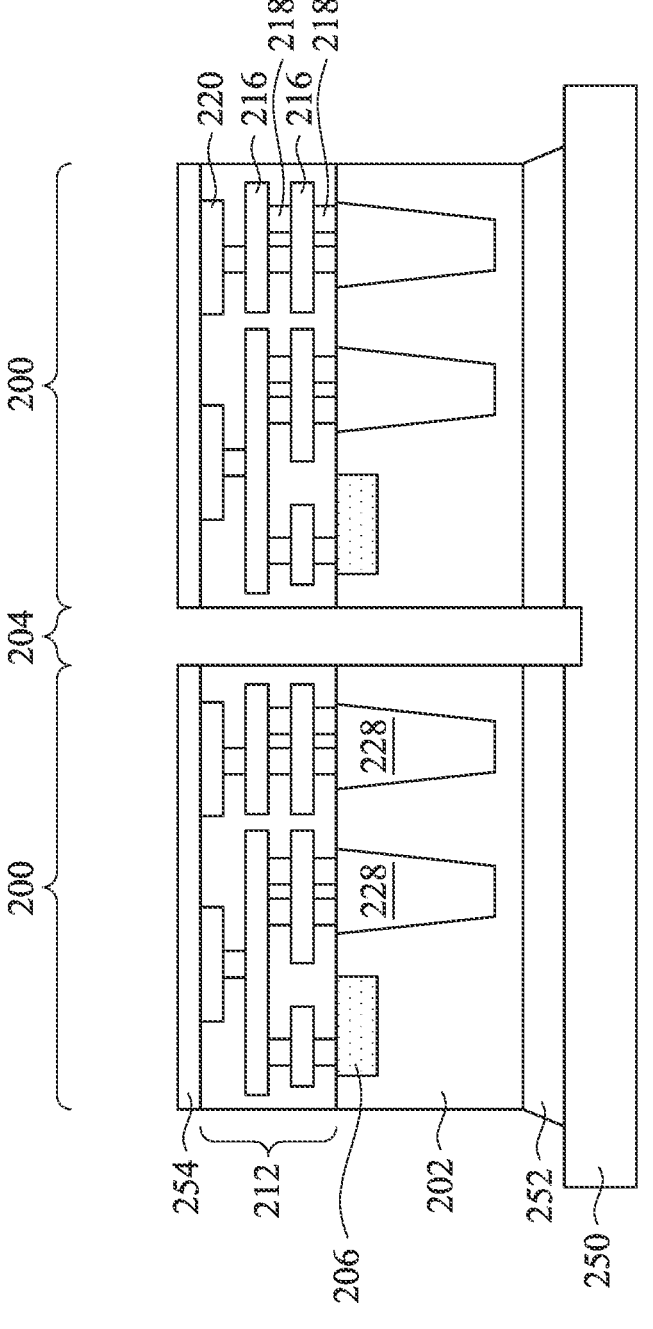

The method 10 at operation 34 (FIG. 1) forms device structures 200 attached to a frame 250 through an adhesive layer 252, which are for singulation through scribe line region 204 exposed in openings of a patterned resist layer 254, such as shown in FIG. 14. The device structure 200 and the formation thereof may be substantially the same as or similar to the device structure 100 described above. The device structure 200 will be bonded to the device structure 100 in subsequent bonding process. The device structure 200 may be an application-specific integrated circuit (ASIC) chip, an analog chip, a sensor chip, a wireless and radio frequency chip, a voltage regulator chip or a memory chip, for example. The device structure 200 and the device structure 100 may be the same type of dies or different types of dies. In some embodiments, the device structure 200 is an active component or a passive component. In the illustrated embodiment, the device structure 200 is smaller than a total area of the device structure 100. The device structure 100 may be also referred to as a base die. In some other embodiments, the size of the device structure 200 is larger than the size of the device structure 100, and the device structure 200 is a base die.

Similar to the device structure 100, the device structure 200 includes a substrate 202, integrated circuit device region(s) 206, an interconnect structure 212 that includes metal lines 216 and vias 218 embedded in insulating layers, and metal pads 220. The material compositions and formation of the substrate 202, the integrated circuit device region(s) 206, interconnect structure 212, the metal pads 220, the adhesive layer 252, the frame 250, and the patterned resist layer 254 may be substantially similar to the substrate 102, the integrated circuit device region(s) 106, the interconnect structure 212, the metal pads 120, the adhesive layer 152, the frame 150, and the patterned resist layer 154 as discussed above, respectively, which are not repeated herein for the sake of simplicity. After the singulation of the device structures 200, the patterned resist layer 254 is subsequently removed using, for example, a suitable ashing or stripping process, such as using an oxygen plasma or the like.

In the depicted embodiment, through vias 228 are formed in the substrate 202. In some embodiments, the through via 228 may also be termed through-silicon-via when the substrate 202 is a silicon-containing substrate. In some embodiments, the through vias 228 extend into the substrate 202 and will be exposed from a backside of the substrate 202 after a backside grinding process. In other words, the through vias 228 may extend between two opposite surfaces of the substrate 202. The through vias 228 may also be referred to as through-substrate-vias (TSVs). In some embodiments, the TSVs 228 include copper, a copper alloy, aluminum, an aluminum alloy or a combination thereof. In some embodiments, the TSVs 228 further includes a diffusion barrier layer (not shown) between the conductive via and the substrate 202. The diffusion barrier layer may include Ta, TaN, Ti, TiN, CoW or a combination thereof.

Figure 15:
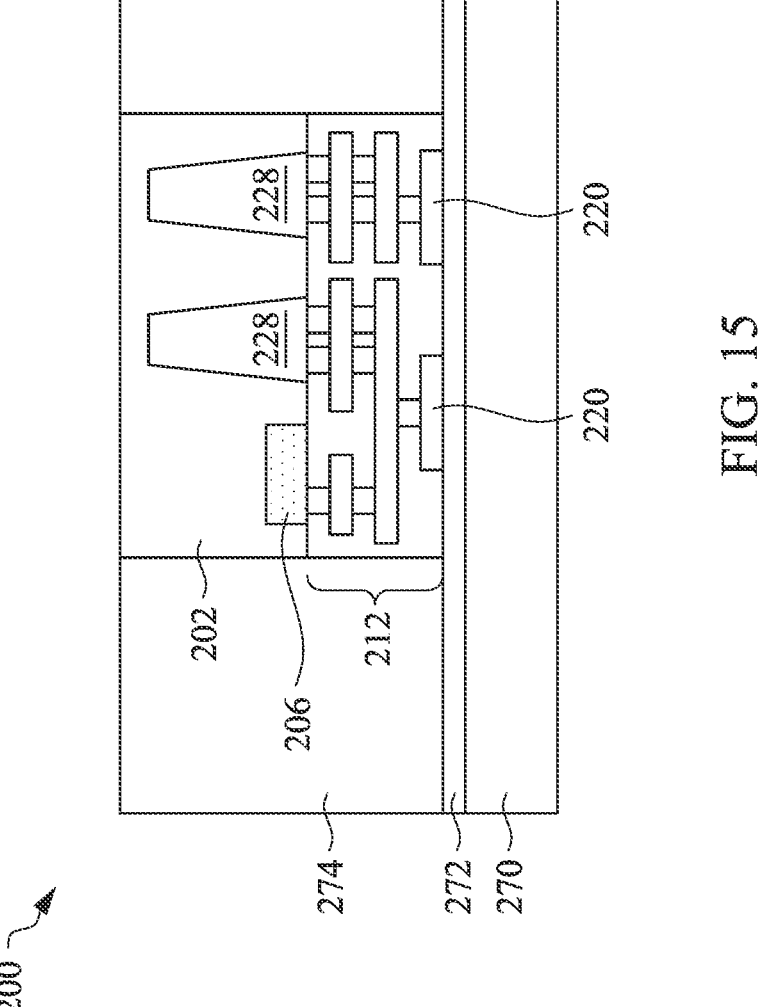

The method 10 at operation 36 (FIG. 1) flips the device structure 200 and attaches the frontside of the device structure 200 to a carrier structure 270 through an adhesive layer 272 using, for example, a pick-and-place process, such as shown in FIG. 15. The carrier structure 270 may be a silicon substrate (e.g., a silicon wafer), a glass substrate, an organic substrate (e.g., a panel), or the like. The adhesive layer 272 may be substantially similar to the adhesive layer 152 discussed above. Dielectric regions 274 (otherwise known as "gap-fill dielectric" regions) are formed surrounding the device structure 200, in some embodiments. The dielectric regions 274 may be formed from one or more layers of silicon oxide, PSG, BSG, BPSG, FSG, silicon nitride, the like, or a combination thereof. The dielectric material of the dielectric regions 274 may be formed using a deposition process such as CVD, PECVD, PVD, the like, or a combination thereof.

Figure 16:
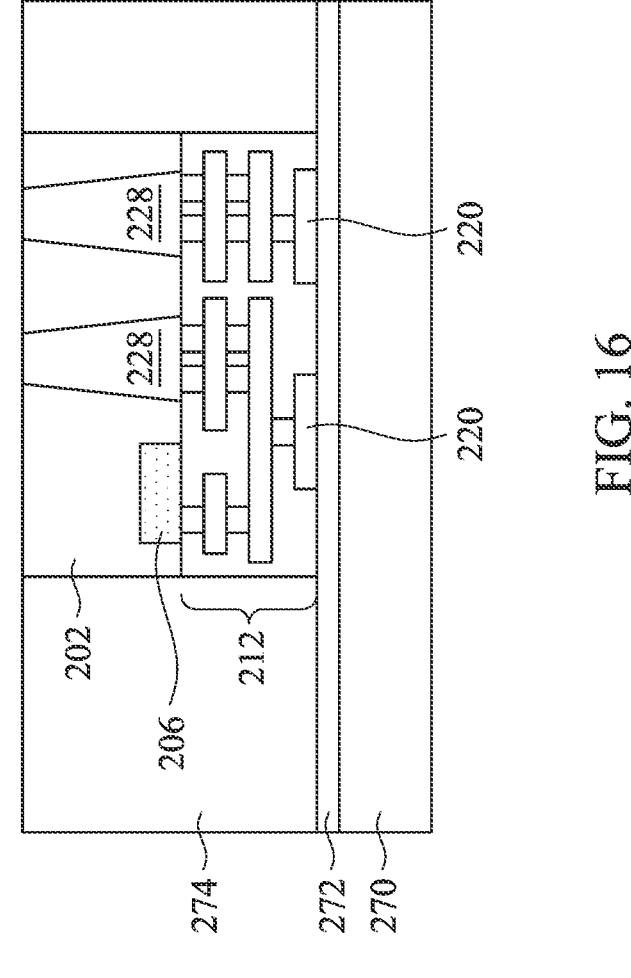

The method 10 at operation 38 (FIG. 1) performs a backside grinding process to thin the device structure 200 from the backside, such as shown in FIG. 16. The backside grinding may be performed by a grinding wheel with a coarse grinding step and a fine grinding step. As a result, a thickness of about 15 um to about 30 um of the substrate 202 may be grinded away. After the backside grinding, TSVs 228 are revealed.

Figure 17:
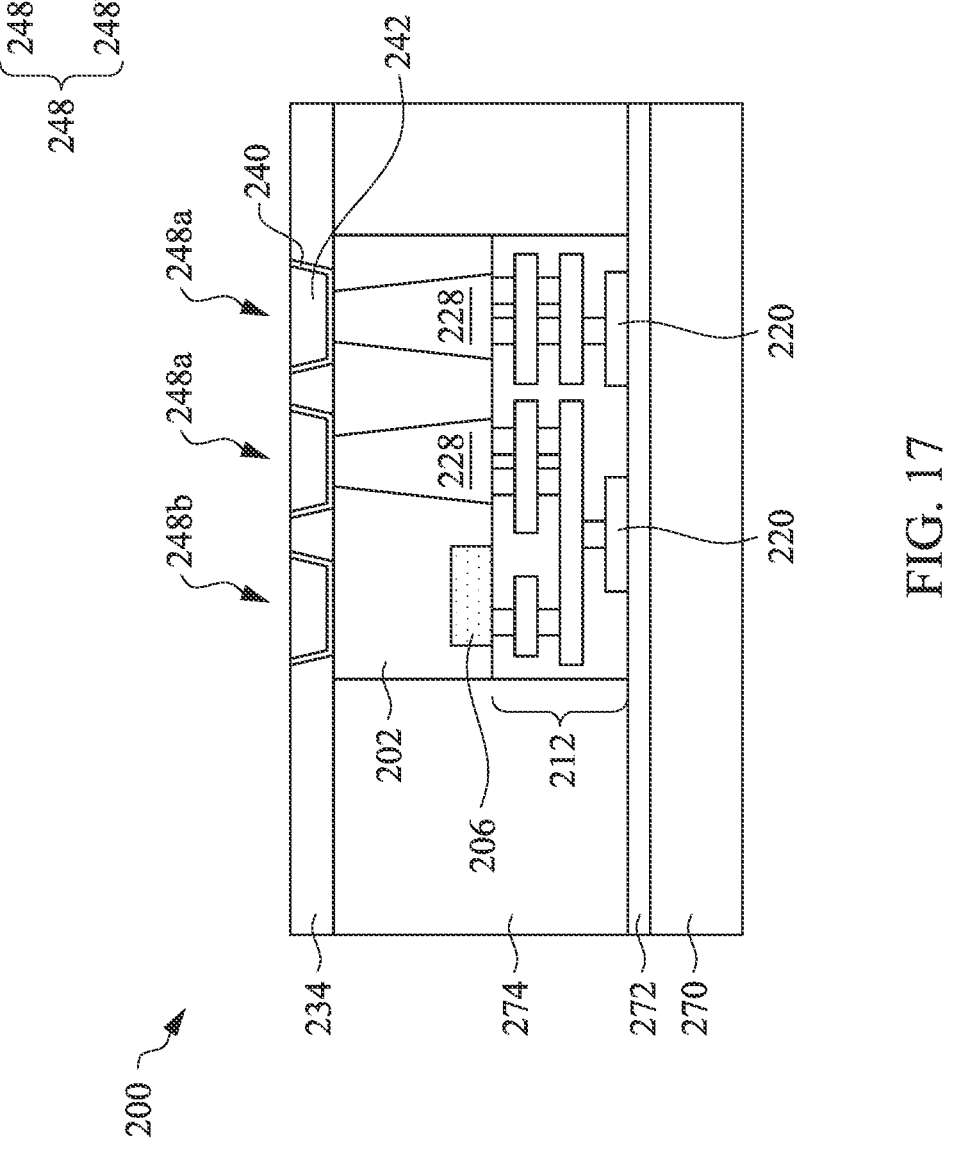

The method 10 at operation 40 (FIG. 1) deposits a dielectric layer 234 over the device structure 200 and forms bond pads 248 in the dielectric layer 234, such as shown in FIG. 17. The dielectric layer 234 may be a single layer or a composite layer comprising a plurality of sub-layers formed of different materials. In some embodiments, the dielectric layer 234 is formed of silicon oxide, silicon oxynitride, silicon oxy-carbide, or the like, and deposited using a deposition process such as CVD, PECVD, PVD, ALD, or the like. Trenches (not shown) are subsequently formed, exposing the backside of the TSVs 228. An anisotropic etch is performed to form the trenches, in some embodiments. The trenches are filled with conductive materials. A barrier layer 240 is conformally deposited. The barrier layer 240 may be, for example, a liner, a diffusion barrier layer, an adhesion layer, or the like. The barrier layer 240 may include one or more layers comprising titanium, titanium nitride, tantalum, tantalum nitride, the like, or combinations thereof. The barrier layer 240 may be deposited as a blanket layer over sidewalls and bottom surfaces of the trenches and in contact with the backside of the TSVs 228. The barrier layer 240 may be formed, for example, using Atomic Layer Deposition (ALD), Physical Vapor Deposition (PVD), or the like. Next, metallic material 242 is deposited, for example, through electro-chemical plating (ECP). The metallic material 242 fills the remaining portions of the trenches. The metallic material 242 may include copper or copper alloy, or another metallic material that can diffuse in a subsequent anneal process, so that metal-to-metal direct bond may be formed. In some embodiments, the metallic material 242 in the device structure 200 and the metallic material 142 in the device structure 100 are the same metallic material, such as copper. A planarization process, such as a CMP process, may be performed to remove excess portions of the metallic material 242 and the barrier layer 240, until the dielectric layer 234 is exposed. The remaining portions of the barrier layer 240 and the metallic material 242 collectively define the bond pads 248. The bond pads 248 include bond pads 248*a* in physical contact with the TSVs 228 and dummy bond pads 248*b* electrically floating in the dielectric layer 234. The dummy bond pads 248*b* in the device structure 200 is to be bonded with the dummy bond pads 148*b* in the device structure 100 to increase uniformity of the distribution of bonding structures.

At the conclusion of operation 40, the method 10 may perform a surface treatment process to the device structure 200. The surface treatment may include a first wet cleaning process similar to the first wet cleaning process in the surface treatment process 158 discussed above, which removes residues and metal oxides from the backside of the device structure 200. Optionally, the surface treatment may also include a second wet cleaning process (or selective etching process) similar to the second wet cleaning process in the surface treatment process 158 in forming recess rings encircling the bond pads 248. Formation of recesses at edge portions of the bond pads 248 in the device structure 200 may be skipped, in some embodiments. Alternatively, recesses at edge portions of the bond pads 248 may be formed in the device structure 200, but skipped in the device structure 100. That is, the device structure 100 and the device structure 200 may either have the recesses encircling respective bond pads, or both, in accordance with some embodiments.

Figure 18:
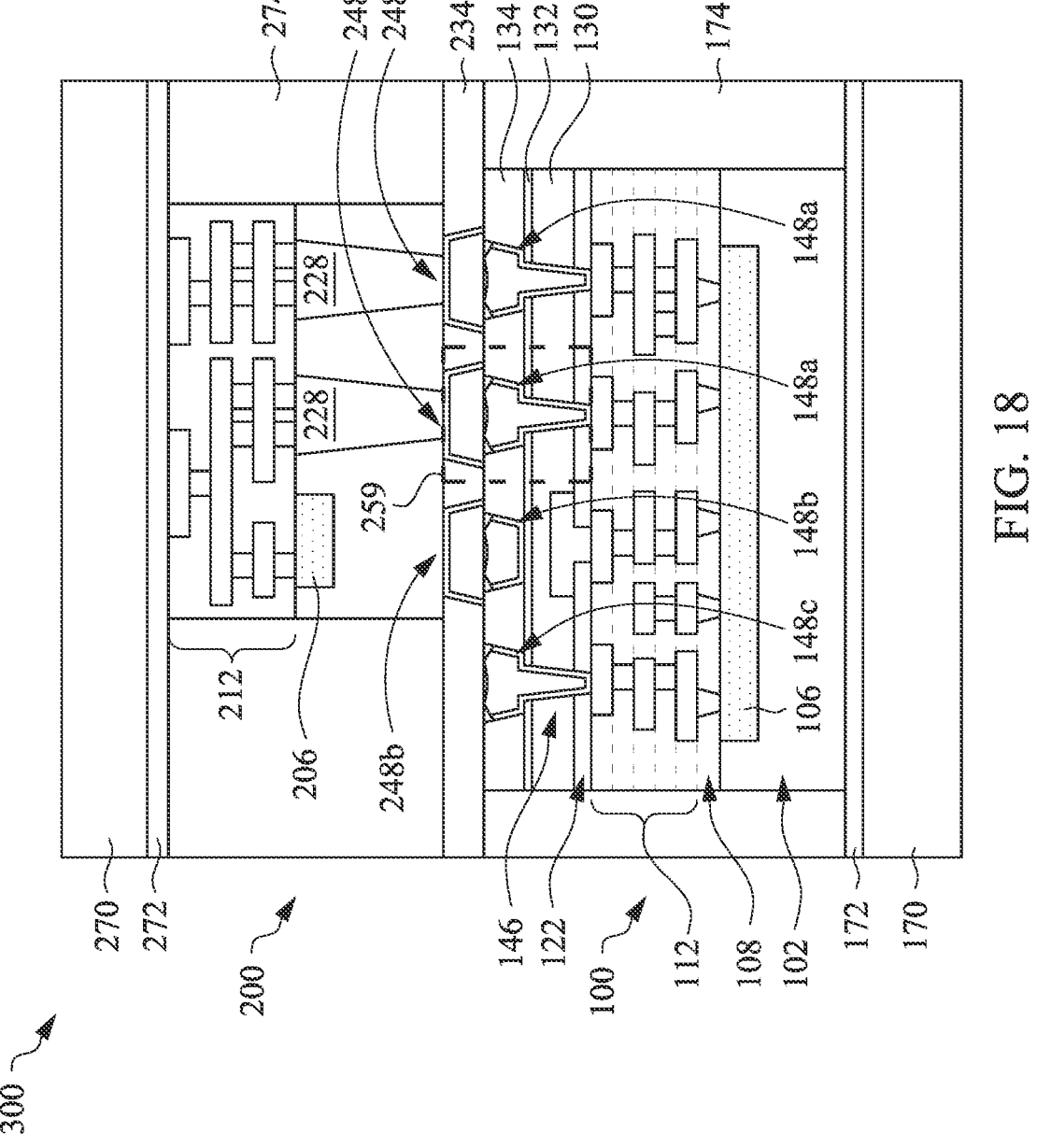

The method 10 at operation 42 (FIG. 1) bonds the device structure 200 to the device structure 100, such as shown in FIG. 18. The bonded device structures 100 and 200 are jointly referred to as the device structure 300. The bonding of the device structure 200 to the device structure 100 may be achieved through hybrid bonding. For example, the bond pads 248 are bonded to the bond pads 148 through metal-to-metal direct bonding. In some embodiments, the metal-to-metal direct bonding is copper-to-copper direct bonding. Particularly, the bond pads 248*a* are bonded to the respective bond pads 148*a*, electrically coupling the interconnect structures 212 and 112; the dummy bond pads 248*b* are bonded to the respective dummy bond pads 148*b*, improving bonding structure uniformity. In the depicted embodiment in FIG. 18, the bond pads 248 have sizes greater than the sizes of the respective bond pads 148. Alternatively, the bond pads 248 may have sizes equal to or smaller than the sizes of the respective bond pads 148. Furthermore, the dielectric layer 234 is bonded to the dielectric layer 134 through dielectric-to-dielectric bonding, which may be fusion bonding, for example, with Si—O—Si bonds generated. The dielectric layer 234 is further bonded to the dielectric material in the gap-fill dielectric regions 174 through dielectric-to-dielectric bonding.

To achieve the hybrid bonding, the device structure 200 are first pre-bonded to the device structure 100 by lightly pressing the device structure 200 against the device structure 100. After pre-bond, an anneal is performed to cause the inter-diffusion of the metals in the bond pads 148 and the corresponding overlying bond pads 248. The annealing temperature may be in the range between about 250° C. and about 550° C. in some embodiments. The annealing time may be in the range between about 1.5 hours and about 8.0 hours in some embodiments. Through the hybrid bonding, the bond pads 248 are bonded to the corresponding bond pads 148 through direct metal bonding caused by metal inter-diffusion.

Figure 24A:
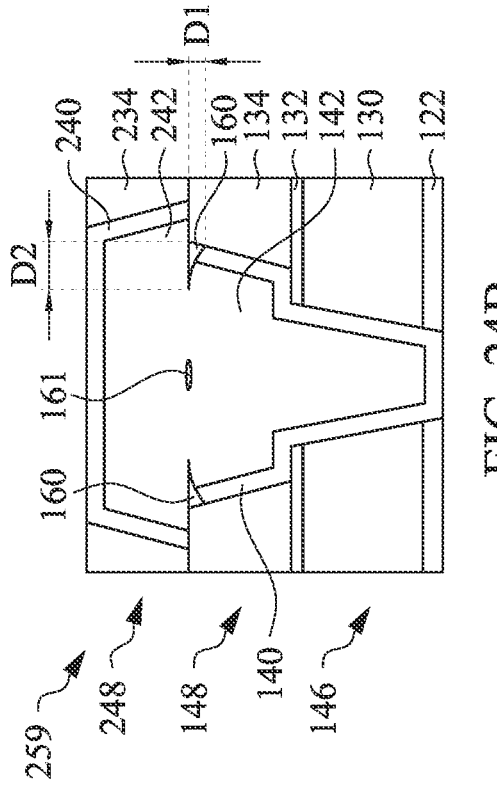
FIGS. 24A, 24B, 24C, 24D, 24E, 24F, 24G, 24H, and 24I illustrate cross-sectional views of metal-to-metal bonds, in accordance with some embodiments of the present disclosure.

A region 259 in FIG. 18 including a bond pad 248, a bond pad 148, and a BPV 146 is depicted separately in FIG. 24A and FIGS. 24B-24I to illustrate cross-sectional views of the region 259 with the recesses 160 after the pre-bonding but before and after the anneal, respectively. It is understood that the recesses 160 with profiles depicted in FIG. 12B is illustrated, which is for purposes of simplicity, while the other profiles depicted such as in FIGS. 12C and 12D may also be equivalently applicable. FIG. 24A illustrates the region 259 prior to the anneal. The recesses 160 are parts of a recess ring of the bond pad 148. In the depicted embodiment as in FIG. 24A, the bond pad 248 does not have recesses, and a size of the bond pad 248 is greater than the size of the bond pad 148, such that the recesses 160 are capped by the metallic material 242. The capped recesses 160 may also be referred to as voids 160 or a void ring 160. The dishing profile of the middle portion of the metallic material 142 is also capped by the metallic material 242 in forming a void 161 therebetween. The barrier layer 140 does not contact the barrier layer 240 in the depicted embodiment.

Figure 24B:
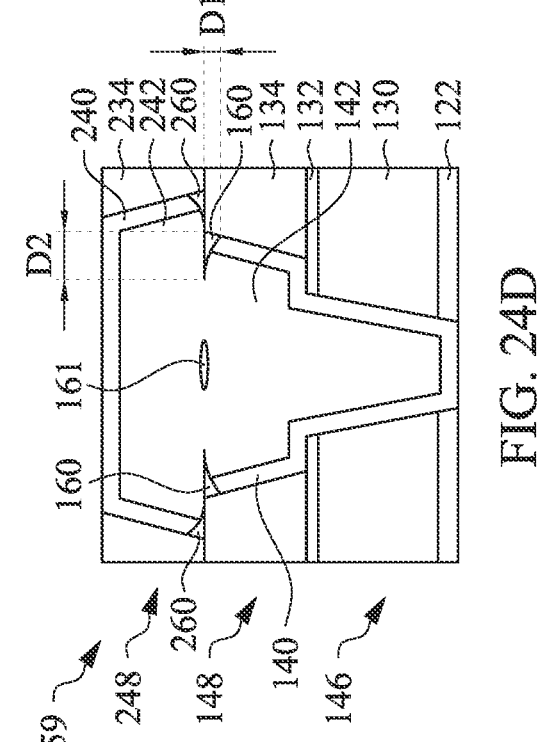
Figure 24C:
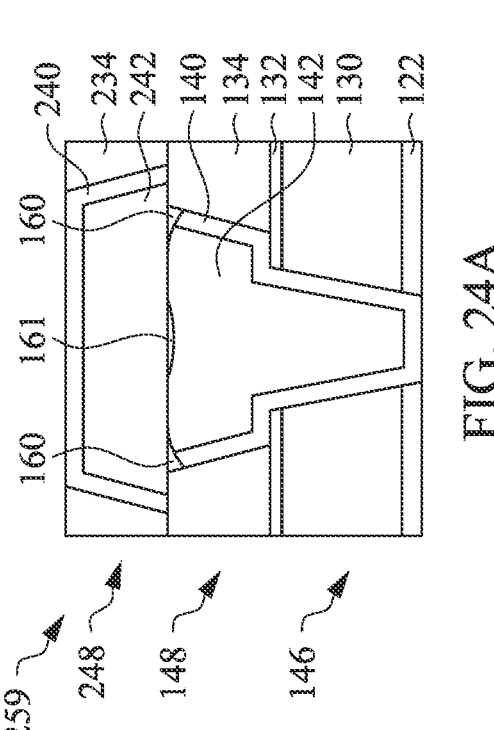
Figure 24D:
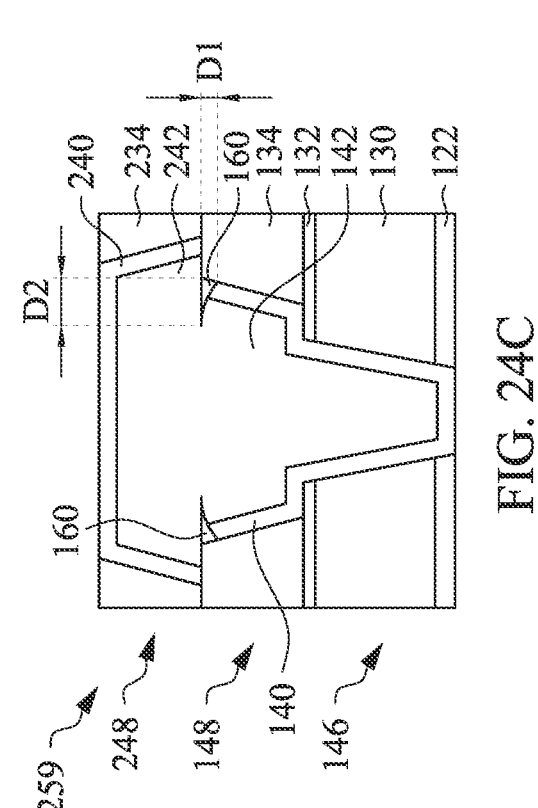

FIG. 24B illustrates the region 259 after the anneal in some embodiments. Due to the inter-diffusion of the bond pads 148 and 248, the metallic material 142 is joined with the metallic material 242. The formation of recesses 160 advantageously reduces the stress generated in the bonded structure. For example, the CTE of the metallic materials 142 and 242 is significantly different from that of the dielectric layers 134 and 234, and the recesses 160 allow some space for the expansion of the metallic materials during thermal cycles (such as the pre-anneal and anneal). The stress suffered by the bonded structure is thus reduced. After the anneal, the shapes and sizes of the recesses 160 and the void 161 may be different from prior to the anneal due to the diffusion of the metallic materials. For example, the size of the void 161 may be smaller than prior to the anneal, and the size of the recesses 160 may be smaller than prior to the anneal. After the anneal, the recesses 160 may have a depth D1 ranging from about 50 nm to about 300 nm and a width D2 ranging from about 50 nm to about 300 nm. The ranges of D1 and D2 are not trivial. If the range is below 50 nm, the space provided by the recesses 160 may not be sufficient to compensate the CTE mismatch. If the range is larger than 300 nm, material discontinuity at recesses may become untrivial in introducing extra warpage instead. FIG. 24C is similar to FIG. 24B. One difference is that the void 161 may disappear after the anneal. FIG. 24D illustrates the embodiment in which recesses 260 are also formed at edge portions of the bond pads 248. The recesses 260 may be larger than the recesses 160 due to the larger size of the bond pads 248. The recesses 260 and the recesses 160 are not merged in the depicted embodiment as in FIG. 24D. The recesses 260 are capped by the dielectric layer 134. A dishing profile also exists in the center portion of the metallic material 242. The void may merge into the void 161 to form a larger void at the center portion of the bonded structure.

Figure 24F:
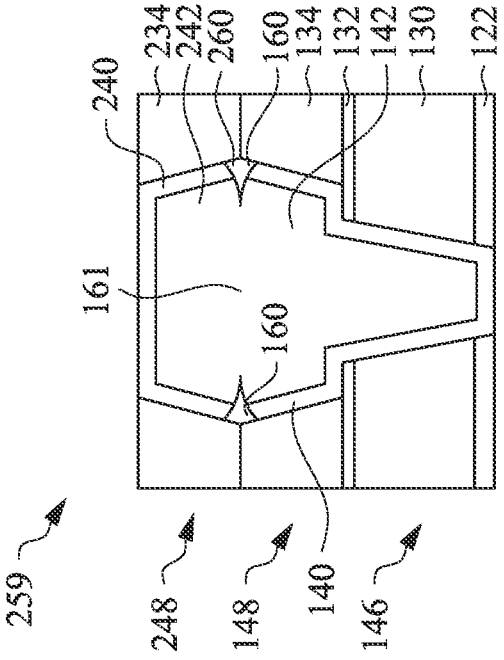
Figure 24E:
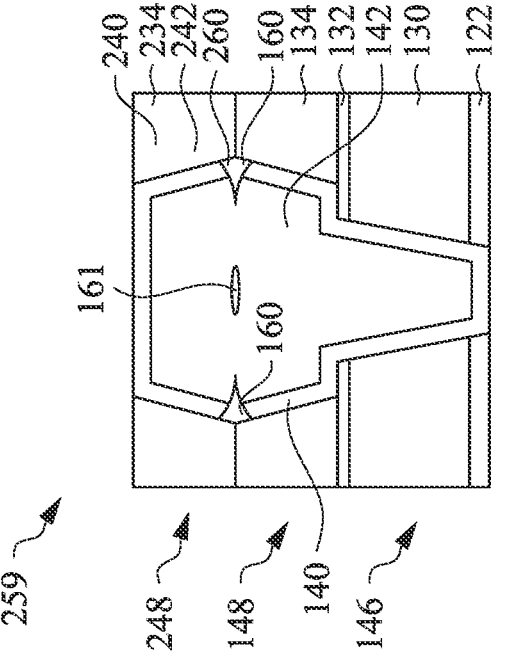

FIG. 24E illustrates the embodiment in which the bond pads 148 and 248 have similar sizes, such that the recesses 160 and 260 are joined. Since the recesses 160 may be parts of a first recess ring, and the recesses 260 may be parts of a second recess ring, the first and the second recess rings may be joined with each other to form a combined recess ring. The voids at the center portion of the bonded structure also merge to form a larger void. FIG. 24F is similar to FIG. 24E. One difference is that the void 161 may disappear after the anneal.

Figure 24I:
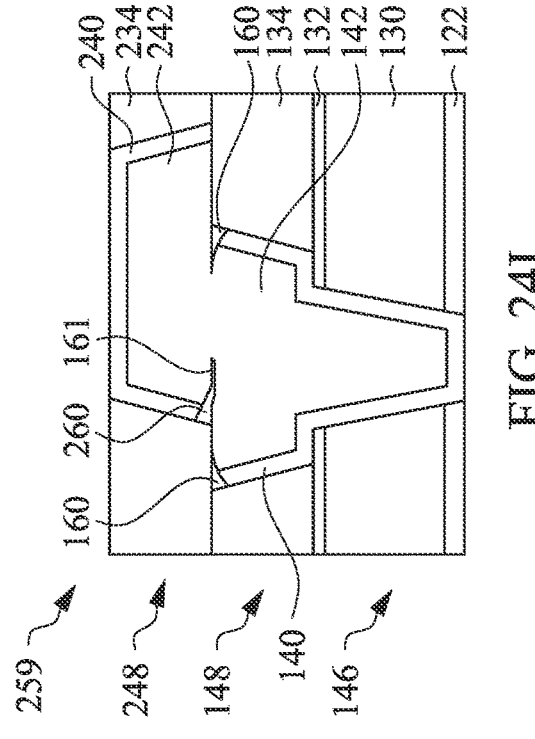
Figure 24G:
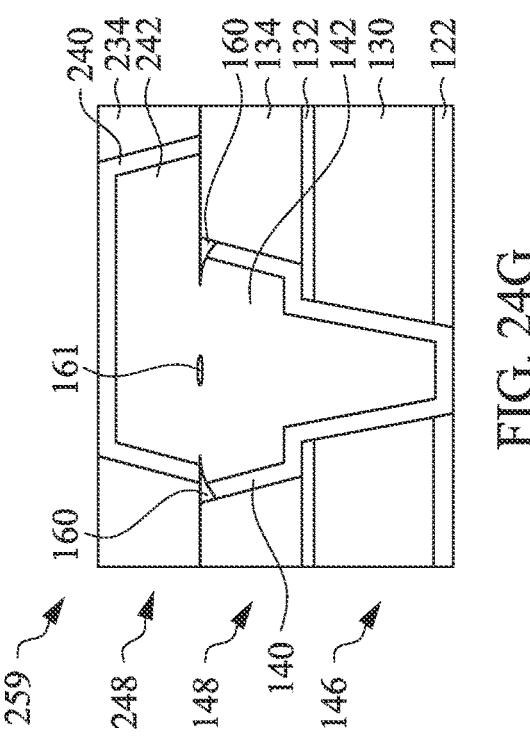
Figure 24H:
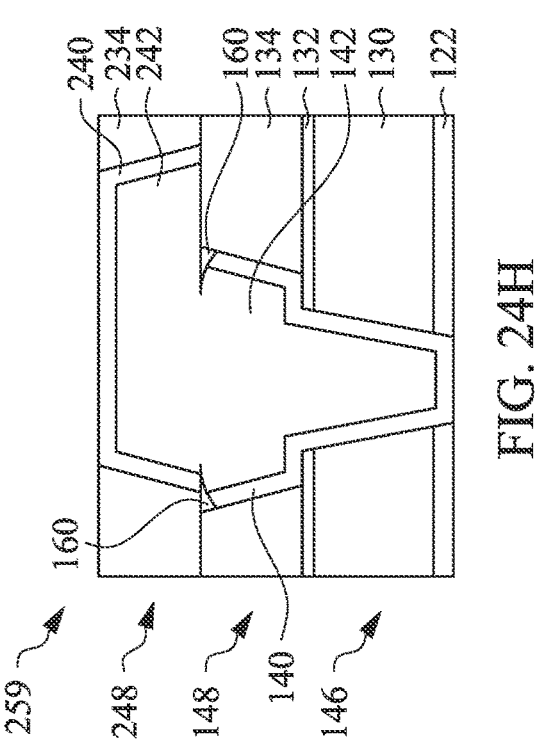

FIGS. 24G, 24H, and 24I illustrate cross-sectional views of the bond pads 148 and 248 after the anneal in accordance with some embodiments, in which the bond pad 248 is misaligned from the bond pad 148. In FIG. 24G, some of the recesses 160 are still capped by the metallic material 242, while some of the recesses 160 are capped by the dielectric layer 234 and the barrier layer 240. The void 161 may exist in the center portion of the bonded structure. In FIG. 24H, due to the inter-diffusion, some of the recesses 160 capped by the metallic material 242 may be filled up by the metallic material 242 and disappear, while some of the recesses 160 capped by the dielectric layer 234 may remain. The void 161 may disappear due to the inter-diffusion. In FIG. 24I, the recesses 260 formed at edge portions of the bond pads 248 may merge with the void 161 due to the misalignment in forming a void extending from edge of the bond pad 248 to a center portion of the bond pad 148.

Figure 19:
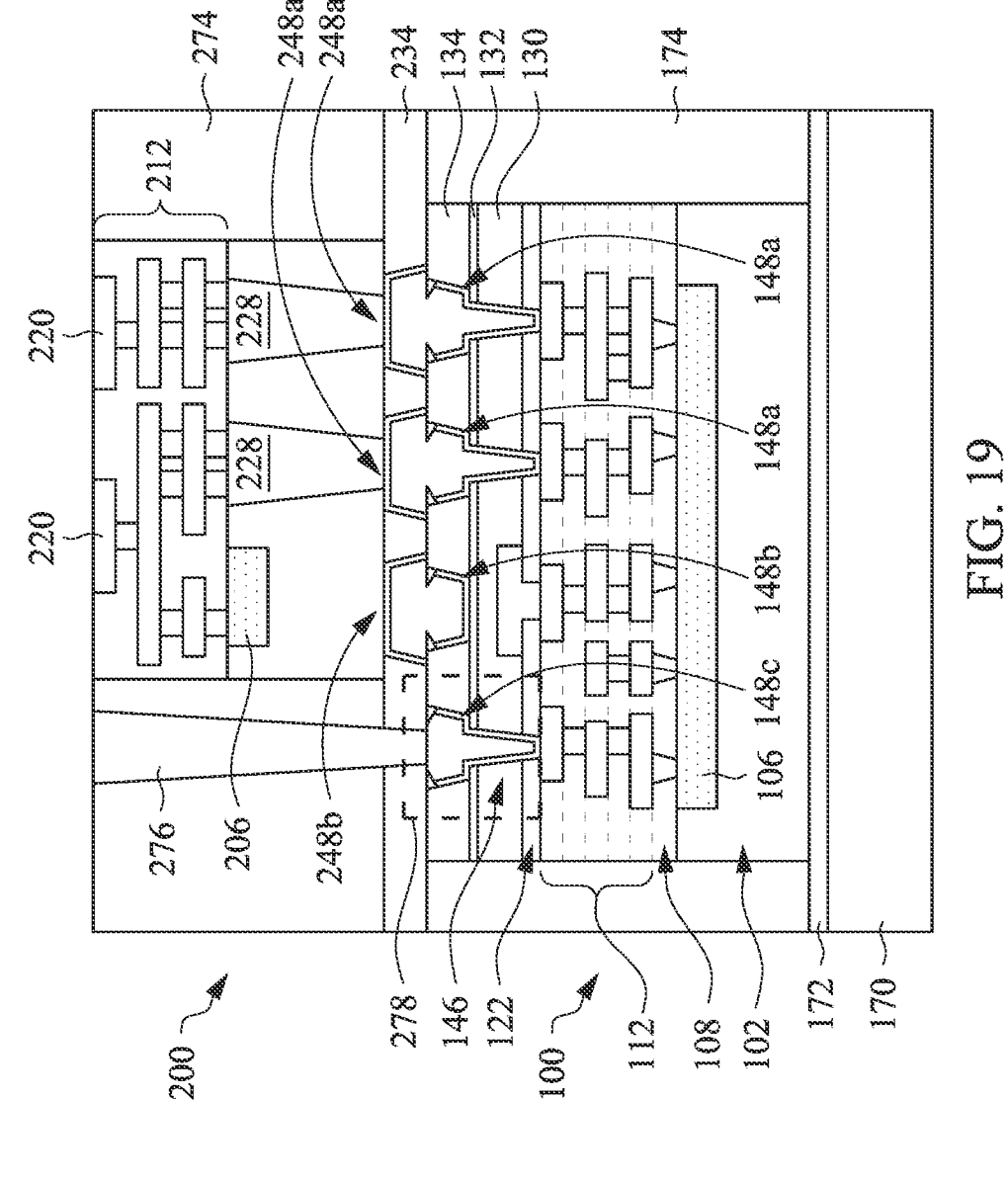

The method 10 at operation 44 (FIG. 1) forms a through dielectric via (TDV) 276 connected to the bond pad 148c, such as shown in FIG. 19. The formation of the TDV 276 may include removing the adhesive layer 272 and the carrier structure 270 from the device structure 200 in an etch process or a grinding process to expose the gap-fill dielectric region 274, performing an etching process to form a through-via hole exposing the bond pads 148c, and filling the through-via hole with conductive materials. The through-via hole extends through the gap-fill dielectric region 274 and the dielectric layer 234. The TDV 276 may include a metallic material such as tungsten, aluminum, copper, or the like. A conductive barrier layer (such as titanium, titanium nitride, tantalum, tantalum nitride, or the like) may also be formed underlying the metallic material. A planarization such as a CMP is performed to remove excess portions of the plated metallic material, and the remaining portions of the metallic material form the TDV 276.

Figure 25B:
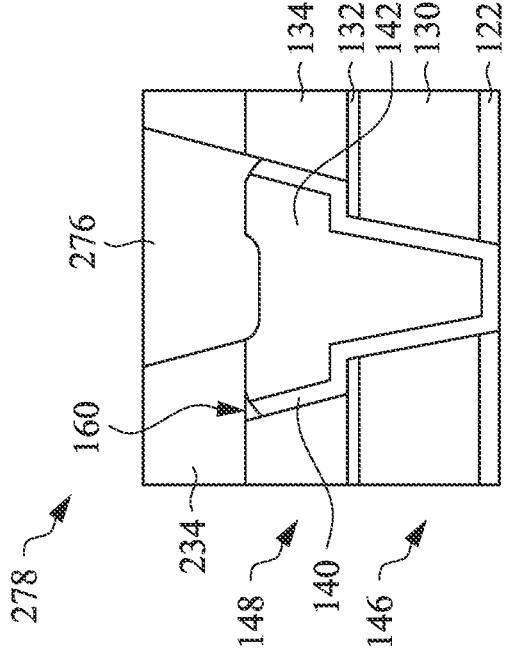
FIGS. 25A and 25B illustrate cross-sectional views of a TSV landing on a bond pad with recesses, in accordance with some embodiments of the present disclosure.
Figure 25A:
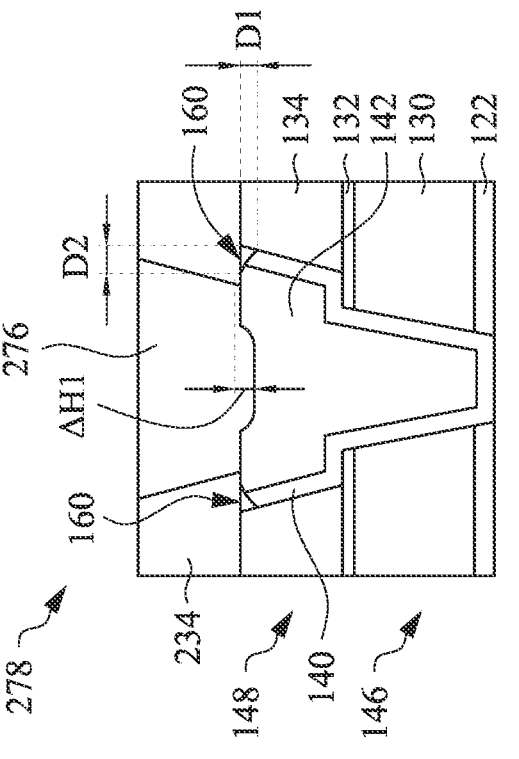

A region 278 in FIG. 19 including the TDV 276, a bond pad 148c, and a BPV 146 is depicted in FIG. 25A. The TDV 276 contacts the center portion of the metallic material 142 and fills the concave space due to the dishing profile. That is, the bottom surface of the TDV 276 may have a convex profile. The recesses 160 are capped by the dielectric layer 234. FIG. 25B is similar to FIG. 25A. One difference is that the misalignment causes some of the recesses 160 to be filled up by the metallic material of the TDV 276 and disappear. Some of the recesses 160 remains being capped by the dielectric layer 234.

Figure 20:
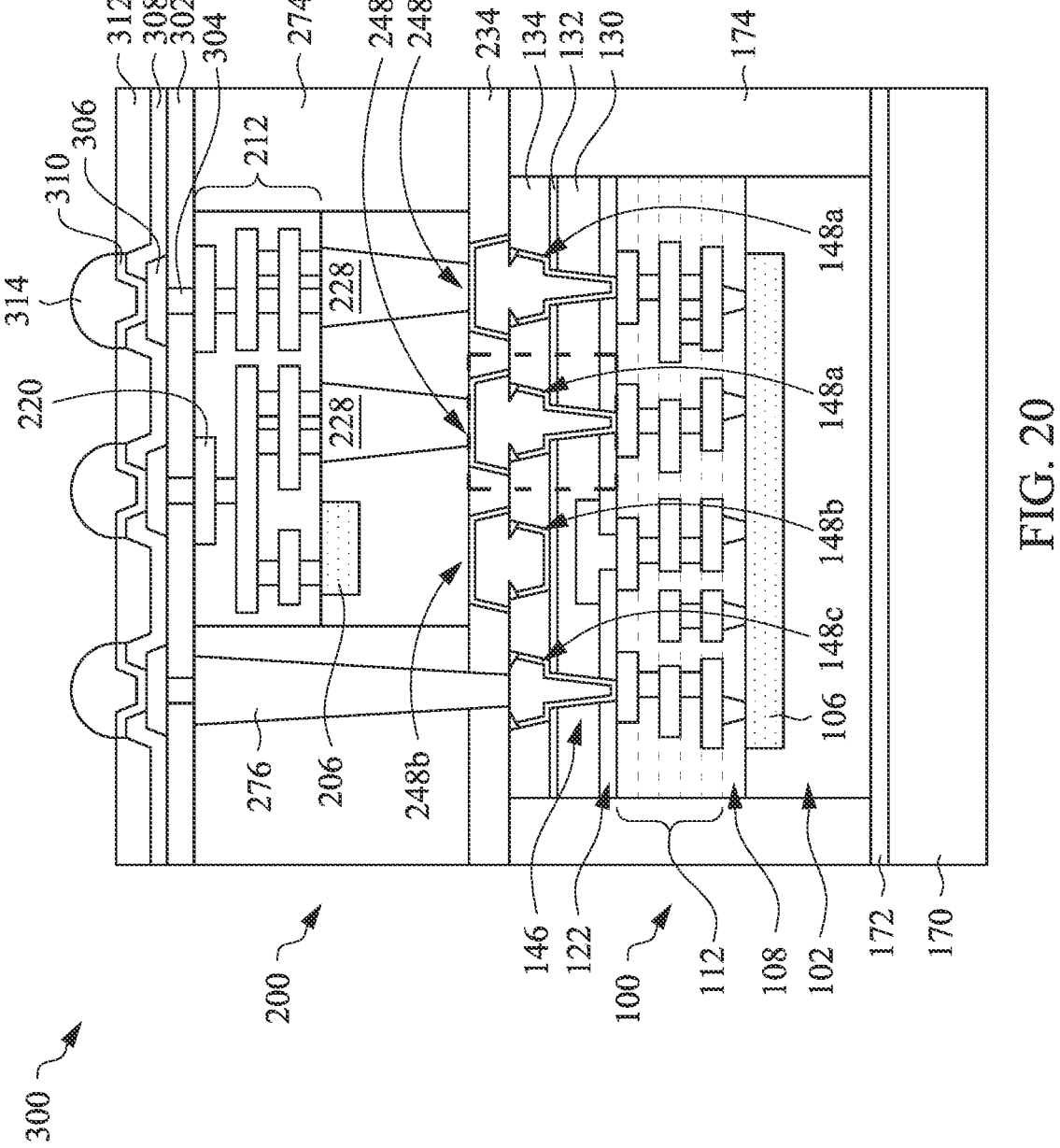

The method 10 at operation 46 (FIG. 1) forms passivation layers, metal pads, and overlying dielectric layers, such as shown in FIG. 20. A passivation layer 302 (sometimes referred to as passivation-1) is formed over the metal pads 220, and vias 304 are formed in passivation layer 302 to electrically connect to the interconnect structure 212 through the metal pads 220. The metal pads 306 are formed over the passivation layer 302, and are electrically coupled to interconnect structure 212 through the vias 304. The metal pads 306 may be aluminum pads or aluminum-copper pads, and other metallic materials may be used. A passivation layer 308 (sometimes referred to as passivation-2) is formed over the passivation layer 302. Each of passivation layers 302 and 308 may be a single layer or a composite layer, and may be formed of a non-porous material. In some embodiments, one or both of passivation layers 302 and 308 is a composite layer including a silicon oxide layer and a silicon nitride layer over the silicon oxide layer. The passivation layers 302 and 308 may also be formed of other non-porous dielectric materials such as un-doped silicate glass (USG), silicon oxynitride, and/or the like. Next, the passivation layer 308 is patterned, so that some portions of passivation layer 308 cover the edge portions of the metal pads 306, and some portions of the metal pads 306 are exposed through the openings in the passivation layer 308. Post-passivation interconnects (PPI) 310 are formed, which may include forming a metal seed layer and a patterned mask layer (not shown) over the metal seed layer, and plating PPIs 310 in the patterned mask layer. The patterned mask layer and the portions of the metal seed layer overlapped by the patterned mask layer are then removed in etching processes. A polymer layer 312 is then formed, which may be formed of PBO, polyimide, or the like. Subsequently, under-bump metallurgies (UBMs) 314 are formed, and UBMs 314 connect to the PPIs 310. In some embodiments, each of the UBMs 314 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in the UBMs 314.

Figure 21:
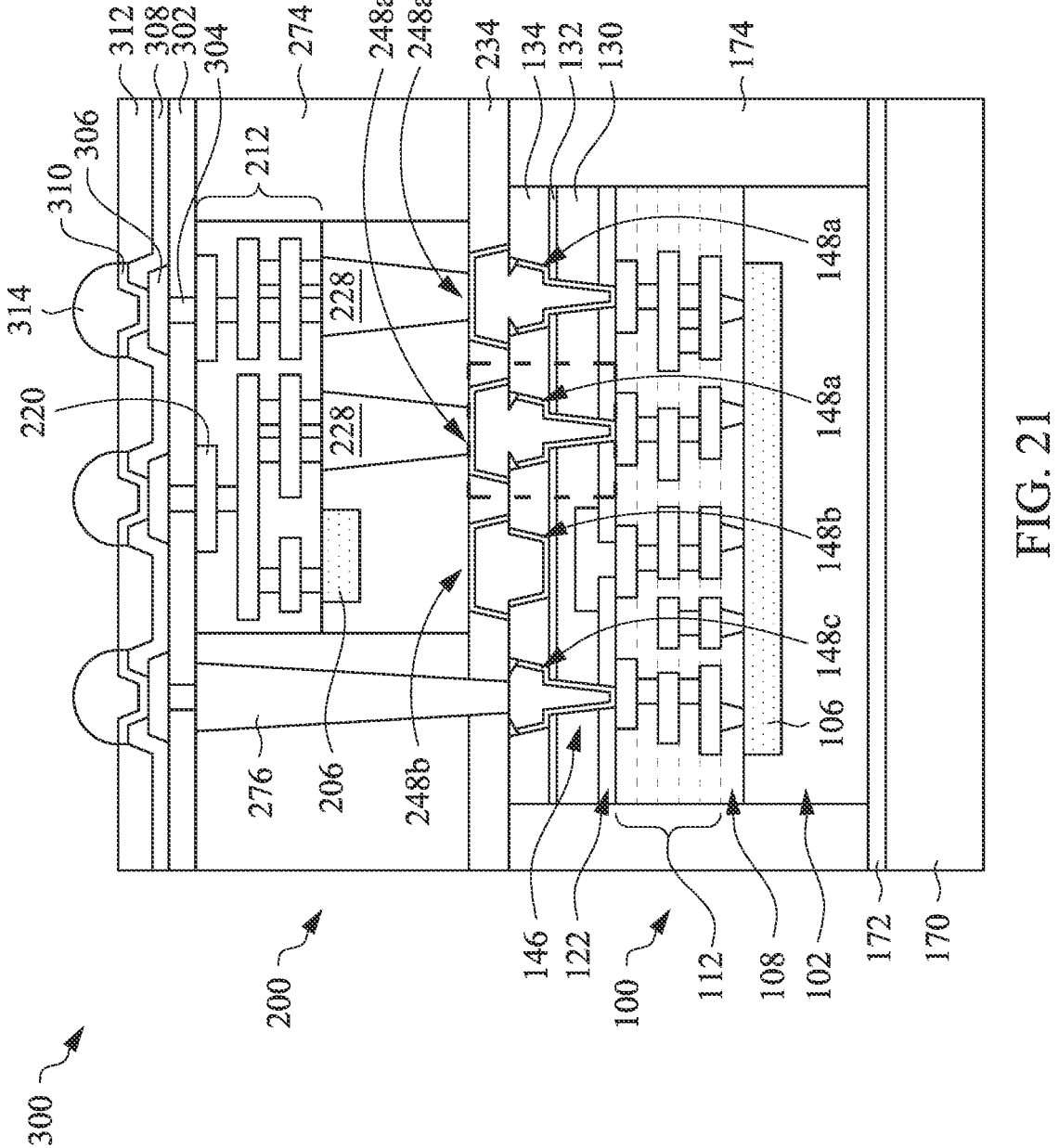
Figure 22:
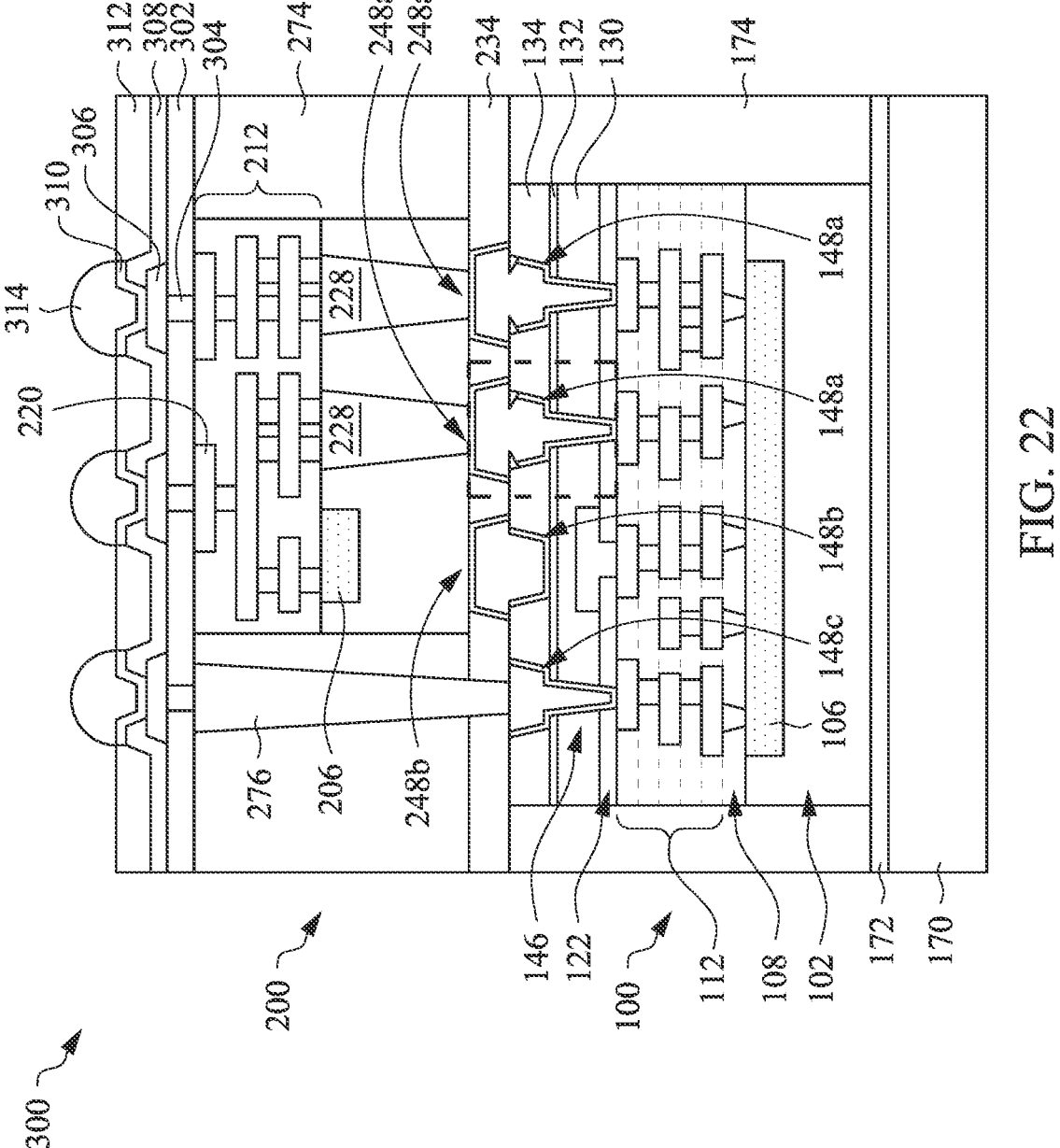

FIG. 21 illustrates an alternative embodiment of FIG. 20, in which not like the bond pads 148*a* and 148*c*, the dummy bond pad 148 is not recessed in the edge portions to form the recesses 160. A resist layer may be deposited on the dummy bond pad 148*b* to protect the dummy bond pad 148*b* from receiving the surface treatment process 158 discussed above. The resist layer is subsequently removed using, for example, a suitable ashing or stripping process, such as using an oxygen plasma or the like. FIG. 22 is similar to the FIG. 21, in which not like the bond pads 148*a*, the bond pad 148*c* and the dummy bond pad 148*b* are not recessed in the edge portions to form the recesses 160. A resist layer may be deposited on the bond pad 148*c* and the dummy bond pad 148*b* to protect bond pads from receiving the surface treatment process 158 discussed above. The resist layer is subsequently removed using, for example, a suitable ashing or stripping process, such as using an oxygen plasma or the like.

Figure 23:
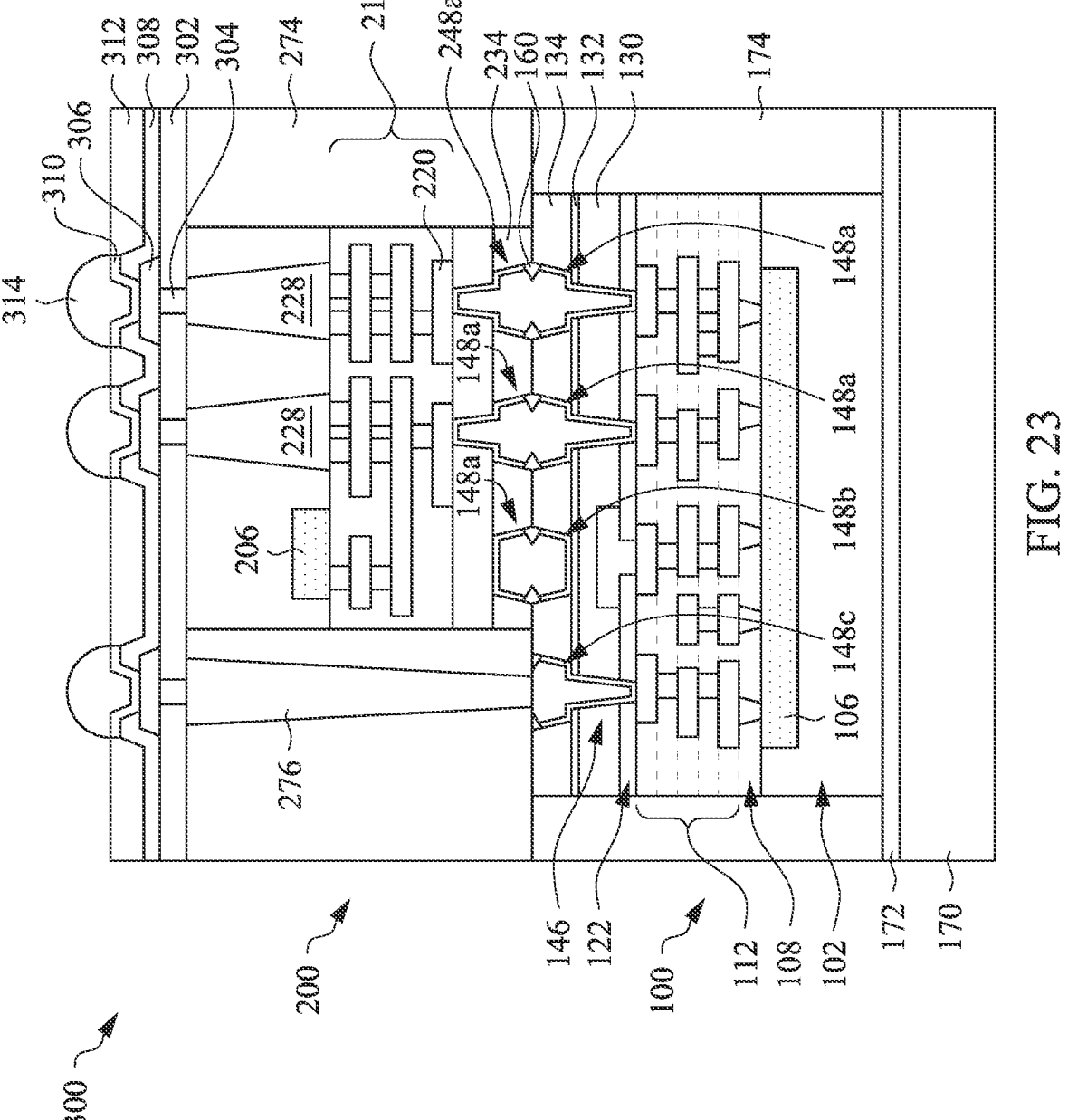

FIGS. 20-22 illustrate a face-to-back structure, in which the device structure 100 has its frontside facing the backside of the device structure 200. FIG. 23 illustrates an alternative embodiment of a face-to-face structure, in which the device structure 100 has its frontside facing the frontside of the device structure 200. Particularly, the TSVs 228 are at the frontside of the bonded device structure 300 and connected to the metal pads 306 through vias 304, and the bond pads 248 and respective BPVs are formed under the metal pads 220 and bonded to the bond pads 148. The bond pads 248 have a size similar to the bond pads 148, and the recesses 160 and 260 are merged into bigger recesses, in the illustrated embodiment, while other embodiments as depicted in FIGS. 24B-24F are also equivalently applicable.

The embodiments of the present disclosure have some advantageous features. By forming recesses encircling bond pads, stress in the bonded structures is reduced, particularly in thermal cycles. The reliability of the bonded structure is thus improved.

In one exemplary aspect, the present disclosure is directed to a method. The method includes depositing a first dielectric layer on a first substrate of a first device die; etching the first dielectric layer to form a trench; depositing a metallic material in the trench and on a top surface of the first dielectric layer; performing a chemical mechanical polish (CMP) process to remove a portion of the metallic material from the top surface of the first dielectric layer, wherein a remaining portion of the metallic material in the trench forms a first metal pad; after the performing of the CMP process, selectively etching the first metal pad to form recesses at an edge portion of the first metal pad; depositing a second dielectric layer on a second substrate of a second device die; forming a second metal pad in the second dielectric layer; and bonding the second device die to the first device die, wherein the second dielectric layer is bonded to the first dielectric layer, and the second metal pad is bonded to the first metal pad. In some embodiments, the recesses are portions of a recess ring encircling the first metal pad in a top view. In some embodiments, the selectively etching is a wet etching process. In some embodiments, an etchant of the wet etching process includes a mixture of sulfinylbis and hydroxylamine. In some embodiments, the selectively etching also forms a dishing profile at a middle portion of the first metal pad. In some embodiments, after the bonding a void is formed between the dishing profile of the first metal pad and the second metal pad. In some embodiments, a size of the second metal pad is larger than a size of the first metal pad, and after the bonding the recesses are capped by the second metal pad. In some embodiments, a width of the recesses ranges from about 50 nm to about 300 nm, and a depth of the recesses ranges from about 50 nm to about 300 nm. In some embodiments, the method further includes selectively etching the second metal pad to form recesses at an edge portion of the second metal pad. In some embodiments, after the bonding the recesses at the edge portion of the first metal pad are merged with the recesses at the edge portion of the second metal pad.

In another exemplary aspect, the present disclosure is directed to a method. The method includes forming a first device structure, forming a second device structure, and bonding the second device structure to the first device structure. In some embodiments, the forming of the first device structure includes depositing a first dielectric layer, forming a first metal pad in the first dielectric layer, and selectively etching an edge portion of the first metal pad to form a first recess. In some embodiments, the forming of the second device structure includes depositing a second dielectric layer, forming a second metal pad in the second dielectric layer, and selectively etching an edge portion of the second metal pad to form a second recess. In some embodiments, the second metal pad is bonded to the first metal pad and the second dielectric layer is bonded to the first dielectric layer. In some embodiments, the second metal pad is larger than the first metal pad, and the first recess is separated from the second recess. In some embodiments, after the bonding the first recess is merged with the second recess. In some embodiments, after the bonding a top surface of the first metal pad and a top surface of the second metal pad form a void therebetween. In some embodiments, the first metal pad includes a barrier layer and a metallic material surrounded by the barrier layer, and after the selectively etching a top surface of the barrier layer is substantially coplanar with a top surface of the first dielectric layer. In some embodiments, the forming of the first device structure further includes forming a first dummy metal pad in the first dielectric layer, the forming of the second device structure further includes forming a second dummy metal pad in the second dielectric layer, and after the bonding the second dummy metal pad is bonded to the first dummy metal pad with a recess ring encircling the bonded first and second dummy metal pads in a top view. In some embodiments, the bonding includes an anneal that reduces sizes of the first recess and the second recess.

In yet another exemplary aspect, the present disclosure is directed to a semiconductor device. The semiconductor device includes a first device structure and a second device structure. In some embodiments, the first device structure includes a first dielectric layer, a first metal pad in the first dielectric layer, and a first void at an edge portion of the first metal pad. In some embodiments, the second device structure includes a second dielectric layer in contact with the first dielectric layer, a second metal pad in the second dielectric layer and in contact with the first metal pad, and a second void at an edge portion of the second metal pad. In some embodiments, the first void is connected with the second void in forming a void ring encircling the first and second metal pads. In some embodiments, the second metal pad is larger than the first metal pad, and the second void is larger than the first void.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first dielectric layer on a first substrate of a first device die;
etching the first dielectric layer to form a trench;
depositing a metallic material in the trench and on a top surface of the first dielectric layer;
performing a chemical mechanical polish (CMP) process to remove a portion of the metallic material from the top surface of the first dielectric layer, wherein a remaining portion of the metallic material in the trench forms a first metal pad;
after the performing of the CMP process, selectively etching the first metal pad in a wet etching process to form recesses at an edge portion of the first metal pad;
depositing a second dielectric layer on a second substrate of a second device die;
forming a second metal pad in the second dielectric layer; and
bonding the second device die to the first device die, wherein the second dielectric layer is bonded to the first dielectric layer, and the second metal pad is bonded to the first metal pad.

2. The method of claim 1, wherein the recesses are portions of a recess ring encircling the first metal pad in a top view.

3. The method of claim 1, wherein an etchant of the wet etching process includes a mixture of sulfinylbis and hydroxylamine.

4. The method of claim 1, wherein the selectively etching also forms a dishing profile at a middle portion of the first metal pad.

5. The method of claim 4, wherein after the bonding a void is formed between the dishing profile of the first metal pad and the second metal pad.

6. The method of claim 1, wherein a size of the second metal pad is larger than a size of the first metal pad, and after the bonding the recesses are capped by the second metal pad.

7. The method of claim 1, wherein a width of the recesses ranges from about 50 nm to about 300 nm, and a depth of the recesses ranges from about 50 nm to about 300 nm.

8. The method of claim 1, further comprising:
selectively etching the second metal pad to form recesses at an edge portion of the second metal pad.

9. The method of claim 8, wherein after the bonding the recesses at the edge portion of the first metal pad are merged with the recesses at the edge portion of the second metal pad.

10. A method comprising:
forming a first device structure comprising:
depositing a first dielectric layer;
forming a first metal pad in the first dielectric layer; and
selectively etching an edge portion of the first metal pad to form a first recess;
forming a second device structure comprising:
depositing a second dielectric layer;
forming a second metal pad in the second dielectric layer; and
selectively etching an edge portion of the second metal pad to form a second recess; and
bonding the second device structure to the first device structure, wherein the second metal pad is bonded to the first metal pad and the second dielectric layer is bonded to the first dielectric layer, wherein after the bonding a top surface of the first metal pad and a top surface of the second metal pad form a void therebetween.

11. The method of claim 10, wherein the second metal pad is larger than the first metal pad, and the first recess is separated from the second recess.

12. The method of claim 10, wherein after the bonding the first recess is merged with the second recess.

13. The method of claim 10, wherein the first metal pad includes a barrier layer and a metallic material surrounded by the barrier layer, and after the selectively etching a top surface of the barrier layer is substantially coplanar with a top surface of the first dielectric layer.

14. The method of claim 10, wherein the forming of the first device structure further includes forming a first dummy metal pad in the first dielectric layer, the forming of the second device structure further includes forming a second dummy metal pad in the second dielectric layer, and after the bonding the second dummy metal pad is bonded to the first dummy metal pad with a recess ring encircling the bonded first and second dummy metal pads in a top view.

15. The method of claim 10, wherein the bonding includes an anneal that reduces sizes of the first recess and the second recess.

16. A semiconductor device comprising:
a first device structure comprising:
a first dielectric layer;
a first metal pad in the first dielectric layer;
a first void at an edge portion of the first metal pad;
a first dummy metal pad in the first dielectric layer; and
a second void at an edge portion of the first dummy metal pad; and
a second device structure comprising:
a second dielectric layer in contact with the first dielectric layer;
a second metal pad in the second dielectric layer and in contact with the first metal pad;
a third void at an edge portion of the second metal pad;
a second dummy metal pad in the second dielectric layer and in contact with the first dummy metal pad; and
a fourth void at an edge portion of the second dummy metal pad.

17. The semiconductor device of claim 16, wherein the first void is connected with the third void in forming a first void ring encircling the first and second metal pads.

18. The semiconductor device of claim 16, wherein the second metal pad is larger than the first metal pad, and the third void is larger than the first void.

19. The semiconductor device of claim 17, wherein the second void is connected with the fourth void in forming a second void ring encircling the first and second dummy metal pads.

20. The semiconductor device of claim 10, wherein the selectively etching of the edge portion of the first metal pad includes applying a wet etchant.

\* \* \* \* \*